United States Patent
Ogawa et al.

(10) Patent No.: US 9,595,535 B1
(45) Date of Patent: Mar. 14, 2017

(54) INTEGRATION OF WORD LINE SWITCHES WITH WORD LINE CONTACT VIA STRUCTURES

(71) Applicant: SANDISK TECHNOLOGIES INC., Plano, TX (US)

(72) Inventors: Hiroyuki Ogawa, Yokkaichi (JP); Makoto Yoshida, Yokkaichi (JP); Kazutaka Yoshizawa, Yokkaichi (JP); Takuya Ariki, Yokkaichi (JP); Toru Miwa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/046,780

(22) Filed: Feb. 18, 2016

(51) Int. Cl.
*H01L 27/115* (2006.01)
*H01L 29/792* (2006.01)

(52) U.S. Cl.
CPC ............................. *H01L 27/11582* (2013.01)

(58) Field of Classification Search
CPC . G03F 7/0002; H01L 21/283; H01L 21/3065; H01L 21/31144; H01L 21/32139; H01L 27/11286; H01L 27/11548; H01L 27/11556; H01L 27/11575; H01L 27/11582
USPC ...... 257/326, 298, 321, 314, 4; 438/671; 1/1
See application file for complete search history.

(56) References Cited

U.S. PATENT DOCUMENTS

| | | |
|---|---|---|
| 5,915,167 A | 6/1999 | Leedy |
| 6,881,994 B2 | 4/2005 | Lee et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |

(Continued)

FOREIGN PATENT DOCUMENTS

WO    WO 02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Mohammed Shamsuzzaman
(74) *Attorney, Agent, or Firm* — The Marbury Law Group PLLC

(57) ABSTRACT

Word line switches in a word line decoder circuitry for a three-dimensional memory device can be formed as vertical field effect transistors overlying contact via structures to the electrically conductive layers for word lines. Via cavities in a dielectric material portion overlying stepped surfaces of the electrically conductive layers can be filled with a conductive material and recessed to form contact via structures. After forming lower active regions in the recesses, gate electrodes can be formed and patterned to form openings in areas overlying the contact via structures. Gate dielectrics can be formed on the sidewalls of the openings, and transistor channels can be formed inside the openings of the gate electrodes. Upper active regions can be formed over the transistor channels.

10 Claims, 20 Drawing Sheets

(56) References Cited

U.S. PATENT DOCUMENTS

| | | | |
|---|---|---|---|
| 7,745,265 B2 | 6/2010 | Mokhlesi et al. | |
| 7,746,680 B2 | 6/2010 | Scheuerlein et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi et al. | |
| 8,053,829 B2 | 11/2011 | Kang et al. | |
| 8,107,270 B2 | 1/2012 | Scheuerlein et al. | |
| 8,187,936 B2 | 5/2012 | Alsmeier et al. | |
| 8,349,681 B2 | 1/2013 | Alsmeier et al. | |
| 8,394,716 B2 | 3/2013 | Hwang et al. | |
| 8,461,000 B2 | 6/2013 | Alsmeier et al. | |
| 8,580,639 B2 | 11/2013 | Alsmeier et al. | |
| 8,603,906 B2 | 12/2013 | Shim et al. | |
| 8,643,142 B2 | 2/2014 | Higashitani et al. | |
| 8,765,543 B2 | 7/2014 | Alsmeier et al. | |
| 8,901,745 B2 | 12/2014 | Hwang et al. | |
| 9,023,719 B2 | 5/2015 | Pachamuthu et al. | |
| 9,196,628 B1 * | 11/2015 | Chen | H01L 27/11582 |
| 9,224,747 B2 | 12/2015 | Mizutani et al. | |
| 9,230,905 B2 | 1/2016 | Takaki et al. | |
| 9,236,392 B1 | 1/2016 | Izumi et al. | |
| 9,337,207 B2 * | 5/2016 | Park | H01L 29/7889 |
| 9,356,043 B1 * | 5/2016 | Sakakibara | H01L 27/11582 |
| 2007/0210338 A1 | 9/2007 | Orlowski | |
| 2007/0252201 A1 | 11/2007 | Kito et al. | |
| 2009/0230449 A1 * | 9/2009 | Sakaguchi | H01L 27/0688 257/298 |
| 2009/0242967 A1 | 10/2009 | Katsumata et al. | |
| 2009/0268523 A1 | 10/2009 | Maejima | |
| 2010/0013049 A1 | 1/2010 | Tanaka et al. | |
| 2010/0044778 A1 | 2/2010 | Seol et al. | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho et al. | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0031546 A1 | 2/2011 | Uenaka et al. | |
| 2011/0076819 A1 | 3/2011 | Kim et al. | |
| 2011/0133606 A1 | 6/2011 | Yoshida et al. | |
| 2011/0169071 A1 | 7/2011 | Uenaka et al. | |
| 2011/0266606 A1 | 11/2011 | Park et al. | |
| 2011/0284943 A1 | 11/2011 | Hwang et al. | |
| 2012/0001247 A1 | 1/2012 | Alsmeier | |
| 2012/0001249 A1 | 1/2012 | Alsmeier et al. | |
| 2012/0001250 A1 | 1/2012 | Alsmeier | |
| 2012/0012920 A1 | 1/2012 | Shin et al. | |
| 2012/0119287 A1 | 5/2012 | Park et al. | |
| 2013/0113033 A1 | 5/2013 | Choi et al. | |
| 2013/0130468 A1 | 5/2013 | Higashitani et al. | |
| 2013/0161821 A1 | 6/2013 | Hwang et al. | |
| 2013/0234101 A1 * | 9/2013 | Sasago | H01L 45/1608 257/4 |
| 2013/0264631 A1 | 10/2013 | Alsmeier et al. | |
| 2013/0313627 A1 | 11/2013 | Lee et al. | |
| 2014/0061766 A1 | 3/2014 | Kito et al. | |
| 2014/0131787 A1 | 5/2014 | Alsmeier | |
| 2014/0175530 A1 | 6/2014 | Chien et al. | |
| 2014/0264934 A1 | 9/2014 | Chen | |
| 2015/0076584 A1 | 3/2015 | Pachamuthu et al. | |
| 2015/0093897 A1 * | 4/2015 | Koh | H01L 27/11286 438/671 |
| 2015/0179659 A1 | 6/2015 | Takaki | |
| 2015/0179660 A1 * | 6/2015 | Yada | H01L 21/02164 257/321 |
| 2015/0236038 A1 * | 8/2015 | Pachamuthu | H01L 27/11582 257/326 |
| 2016/0064281 A1 | 3/2016 | Izumi et al. | |
| 2016/0141300 A1 * | 5/2016 | Hsiao | H01L 27/11575 257/314 |
| 2016/0268269 A1 * | 9/2016 | Ichinose | H01L 27/1157 |
| 2016/0276359 A1 * | 9/2016 | Oginoe | H01L 27/11582 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

International Search Report and Written Opinion, International Application No. PCT/US2015/021767; issued Jun. 24, 2015.

U.S. Appl. No. 14/291,415 RI, filed May 30, 2014, SanDisk 3D LLC.

U.S. Appl. No. 14/517,134, filed Oct. 17, 2014, SanDisk Technologies Inc.

U.S. Appl. No. 14/723,868, filed May 28, 2015, SanDisk Technologies Inc.

U.S. Appl. No. 14/739,284, filed Jun. 15, 2015, SanDisk Technologies Inc.

U.S. Appl. No. 14/739,354, filed Jun. 15, 2015, SanDisk Technologies Inc.

U.S. Appl. No. 14/832,579, filed Aug. 21, 2015, SanDisk Technologies Inc.

U.S. Appl. No. 14/925,224, filed Oct. 28, 2015, SanDisk Technologies Inc.

U.S. Appl. No. 14/995,017, filed Jan. 13, 2016, SanDisk Technologies Inc.

U.S. Appl. No. 15/043,761, filed Feb. 15, 2016, SanDisk Technologies Inc.

* cited by examiner

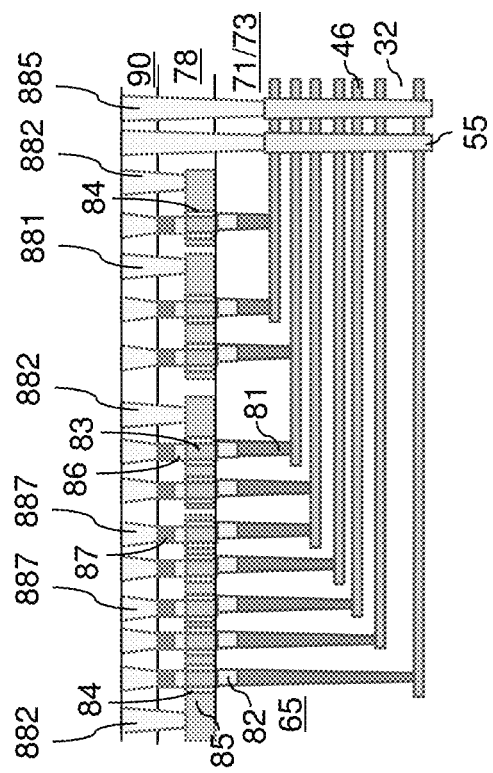
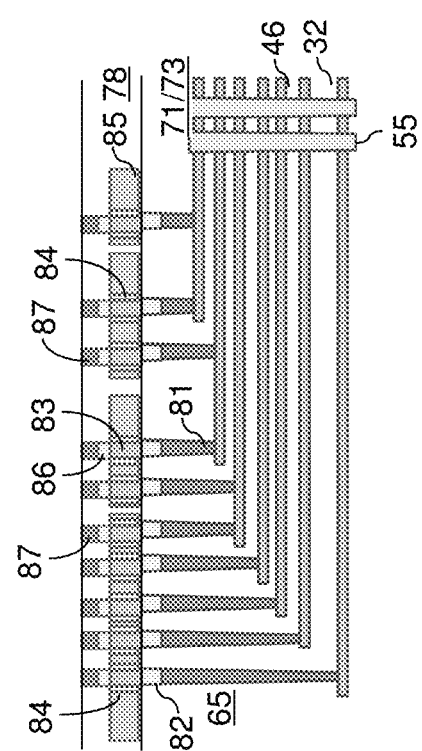
FIG. 12J
FIG. 12I

INTEGRATION OF WORD LINE SWITCHES WITH WORD LINE CONTACT VIA STRUCTURES

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a memory device comprises an alternating stack of insulating layers and electrically conductive layers located over a substrate, wherein the electrically conductive layers form stepped surfaces, memory stack structures extending through the alternating stack and including a memory film and a vertical semiconductor channel, and vertical field effect transistors which are located over the stepped surfaces and which electrically contact a respective electrically conductive layer.

According to another aspect of the present disclosure, a method of making a memory device includes forming memory stack structures that extend through an alternating stack of insulating layers and electrically conductive layers located over a substrate, wherein the memory stack structure includes a memory film and a vertical semiconductor channel, forming contact via structures on the electrically conductive layer, and forming vertical field effect transistors on respective contact via structures.

BRIEF DESCRIPTION OF THE DRAWINGS

FIG. 12A-12J are sequential vertical cross-sectional views of a region of the exemplary structure during formation of vertical field effect transistors according to an embodiment of the present disclosure.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
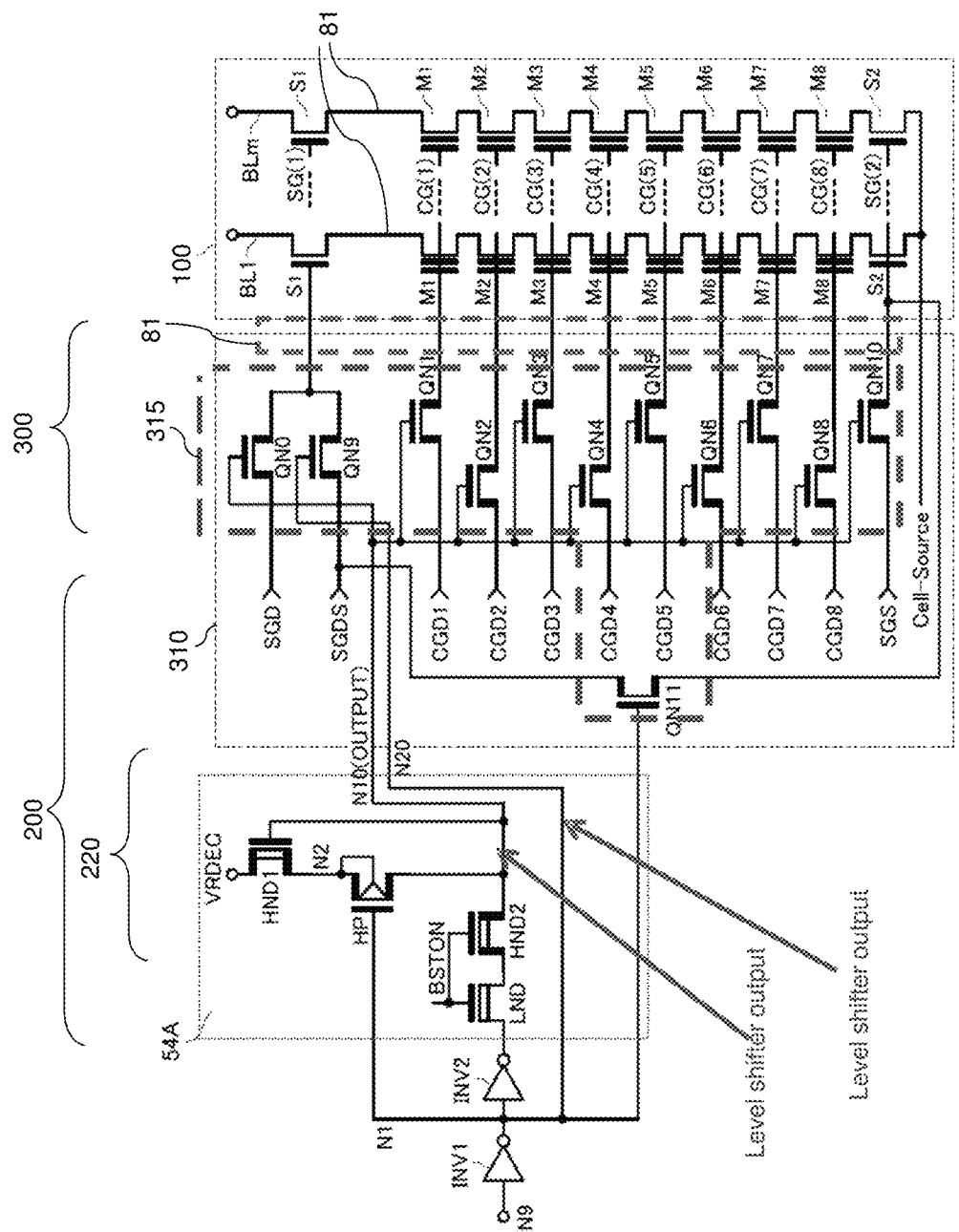
FIG. 1 is a schematic diagram of a word line decoder circuitry incorporating vertical field effect transistors as word line select transistors according to embodiments of the present disclosure.

Referring to FIG. 1, a word line decoder circuitry 310 including vertical field effect transistors 315 for a three-dimensional memory device is shown. The vertical field effect transistors 315 have a source to drain direction which is substantially perpendicular to the top surface 7 of the substrate (9, 10) shown in FIG. 2. In other words, one of source or drain of a vertical transistor is located above the channel and the other one of the source or drain of the vertical transistor. The vertical transistors 315 may be word line and control gate electrode switching transistors. The three-dimensional memory device can include a three-dimensional memory cell array 100 that includes m vertical NAND strings 101, where m is an integer that may range from 64 to 1024, for example. A level shifter circuitry 54A can be employed to provide two output signals via nodes (e.g., lines) N10, N20 to the vertical field effect transistors.

Each vertical NAND string 101 is connected to a bit line BLi for which the index i runs from 1 to m at the drain side, and connected to a common source electrode labeled "Cell-Source." Each of the m vertical NAND strings can include K memory elements Mj that are vertically stacked and controlled by respective control gate electrodes, for which the index j runs from 1 to K. FIG. 1 illustrates an example in which K is 8. However, K can be any suitable integer, such as 8 to 1024, such as 64 to 256. Read, programming, and erase operations on the memory elements can be performed employing K control gate electrodes CG(j) for which the index j runs from 1 to K. Select gate electrodes SGp where p is any suitable integer (e.g., SG1, SG2) can be provided above, and/or below, the memory elements in each vertical NAND string. The select gate electrodes comprise electrodes of drain side select transistors (e.g., S1) or source side select transistors (e.g., S2)

The vertical field effect transistors QNt (where t is any suitable integer) are formed over word line contact via structures 81 that contact electrically conductive layers that function as the word lines and select gate electrodes of the vertical NAND strings 101. The number of the vertical field effect transistors QNt may be at lease the sum of the total number of word lines and select gate electrodes. First active regions (which may be source regions or drain regions) of the vertical field effect transistors QNt can be electrically shorted to respective underlying word line contact via structures 81. Second active regions (which may be drain regions or source regions) of the vertical field effect transistors QNt can be electrically shorted to various control nodes, which can include control gate output nodes CGDj (for which the index j runs from 1 to K), at least one source-side select gate node SGS, at least one drain-side select gate node SGD, and a source and drain select gate node SGDS. The vertical field effect transistors QNt can include one or more vertical field effect transistors that controls select gate electrodes (such as QN0, QN9, QN10 and QN11). Node N10 connects to the gate electrodes of all of the switching transistors shown in FIG. 1 except transistors QN9 and QN11, while node N20 connects to the gate electrodes of transistors QN9 and QN11.

Figure 2:
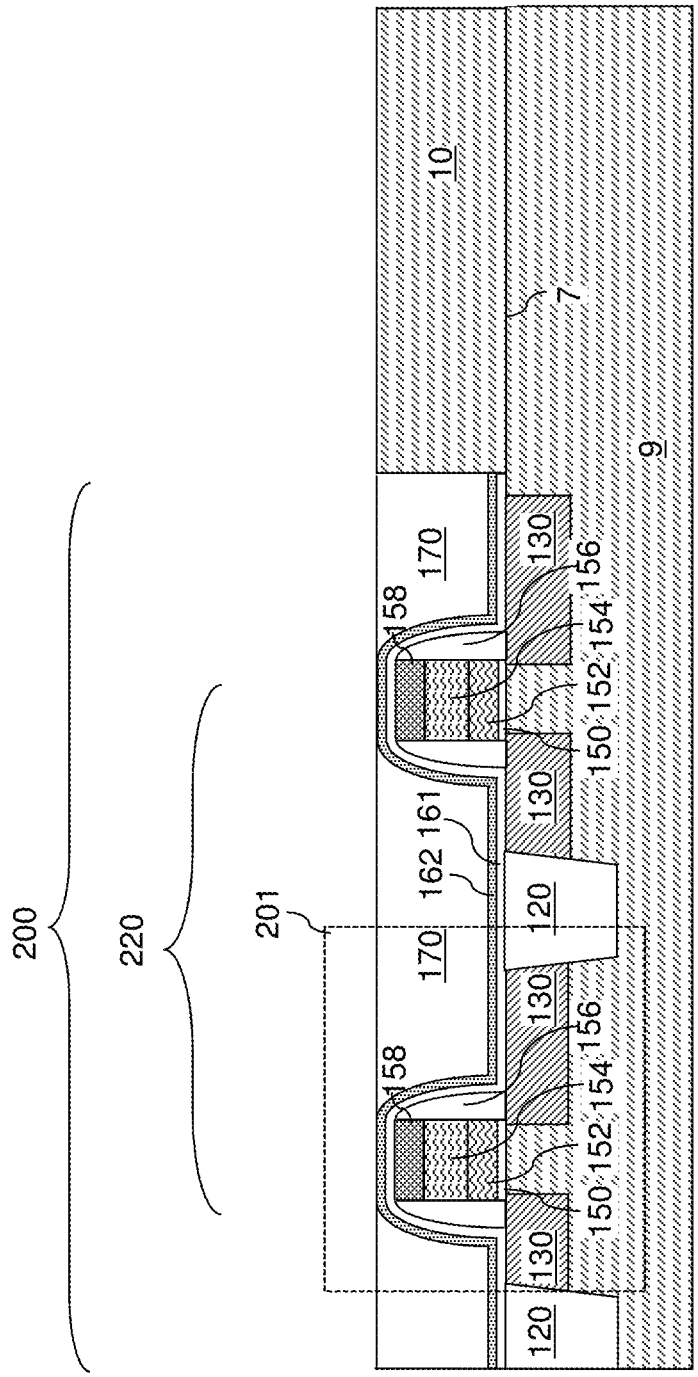
FIG. 2 is a vertical cross-sectional view of an exemplary structure after formation of peripheral devices that can be employed for a peripheral circuitry

The three-dimensional memory cell array 100 can be formed prior to formatting the vertical field effect transistors QNt. Referring to FIG. 2, an exemplary structure including a three-dimensional memory cell array 100, a peripheral device region 200 (which can include the level shifter circuitry 54A and the various control nodes (CGDj, SGS, SGD, SGDS)), and a stepped terrace region 300 including terraces of electrically conductive layers 46 on which the word line contact via structures 81 can be subsequently formed. In an embodiment, the peripheral device region 200 includes a substrate level peripheral device region 220 containing one or more devices, such as capacitors, diodes or transistors 201 located on or in the substrate (9, 10). The transistors 201 may include the transistors of the data latch/level shifter circuitry 54A. Thus, the word line/row driver circuitry is split into a data latch/level shifter/other row driver circuitry portion 54A/220 which is located in or on the substrate, and the word line switching transistors 315 which are located above the stepped word line contact region 300, which reduces the area and the die size of the device.

Referring to FIG. 2, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material (e.g., single crystal silicon wafer), at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors 201. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region including the semiconductor devices is herein referred to as a peripheral device region 200. The peripheral device region 200 can include various peripheral devices needed to operate the memory devices of the present disclosure, and can include components of the word line driver/row driver circuitry (e.g., level shifter circuitry or other row driver circuitry) of FIG. 1 other than the vertical field effect transistors 315 which are used as word line and select gate electrode switches.

Figure 3A:
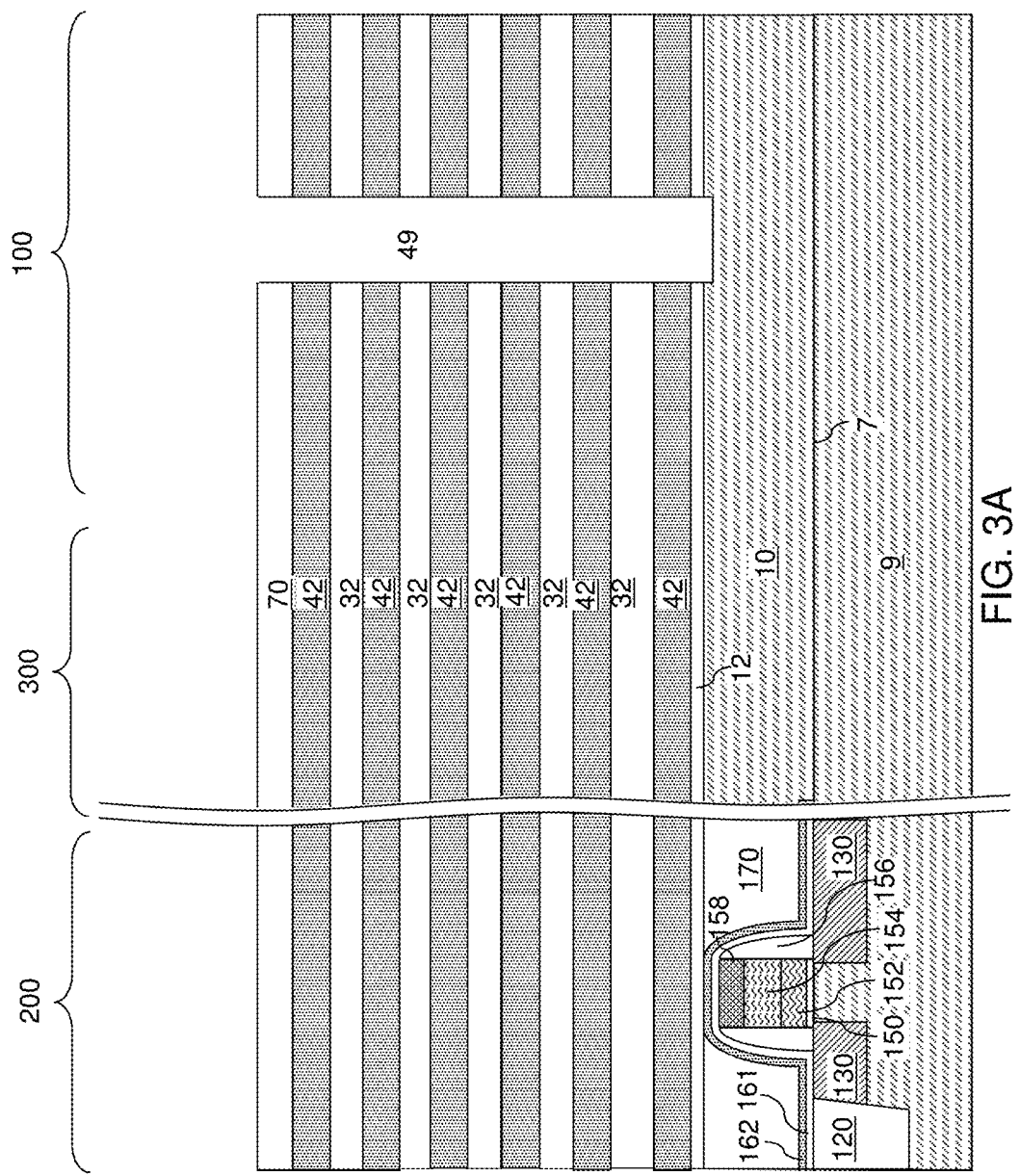
FIG. 3A is a vertical cross-sectional view of the exemplary structure after formation of an alternating stack of insulating layers and sacrificial material layers and memory openings according to an embodiment of the present disclosure.
Figure 3B:
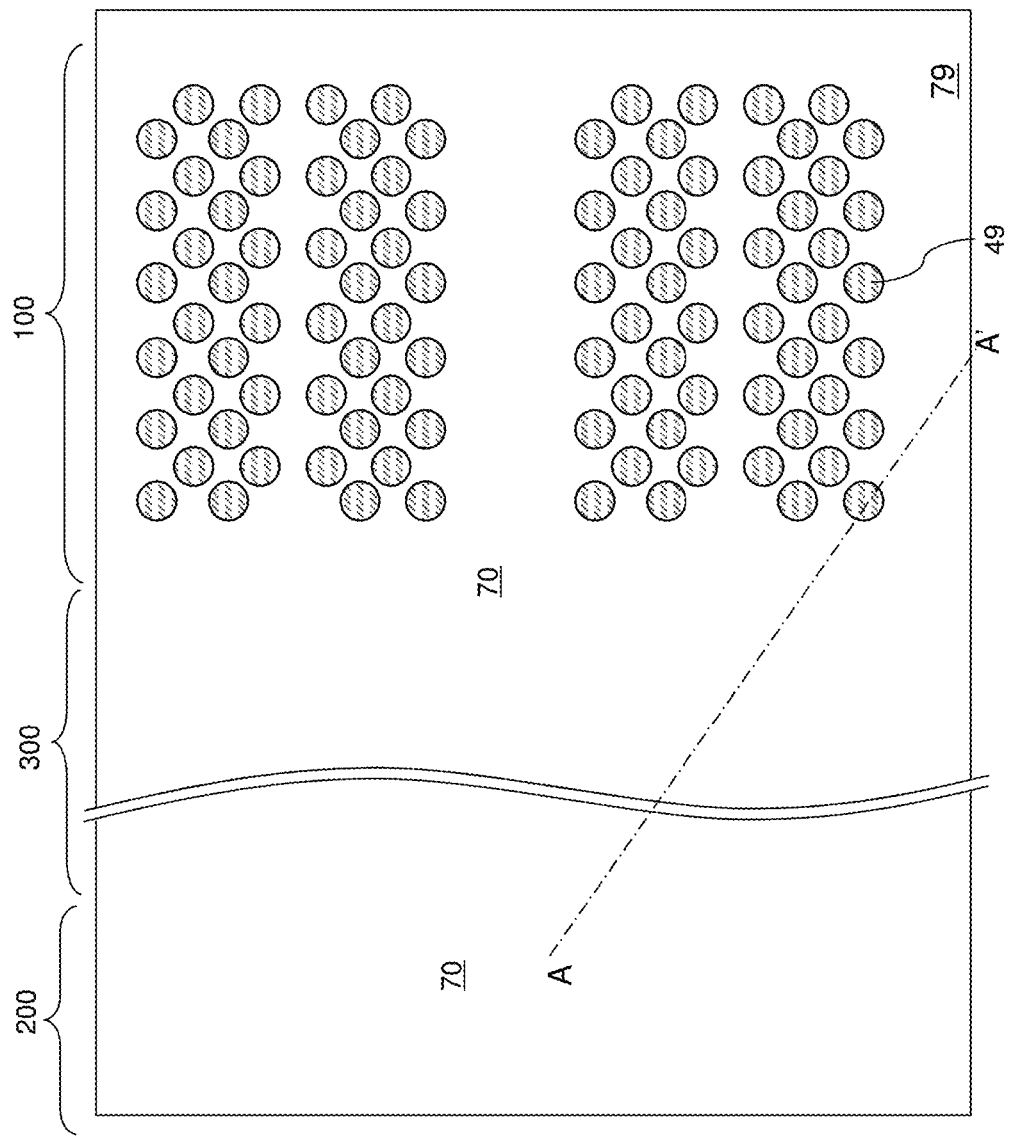
FIG. 3B is a partial see-through top-down view of the exemplary structure of FIG. 3A. The vertical plane A-A' is the plane of the vertical cross-sectional view of FIG. 3A.

Referring to FIGS. 3A and 3B, a gate dielectric layer 12 can be optionally formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

A stack of an alternating plurality of first material layers (which can be insulating layers 32) and second material layers (which can be sacrificial material layers 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein. The sacrificial material layers 42 (which are spacer material layers) are subsequently replaced with control gate electrodes, source select gate electrodes, and drain select gate electrodes for a NAND string.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

Each memory opening 49 extends through the insulating cap layer 70, the alternating stack (32, 42), the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Figure 4:
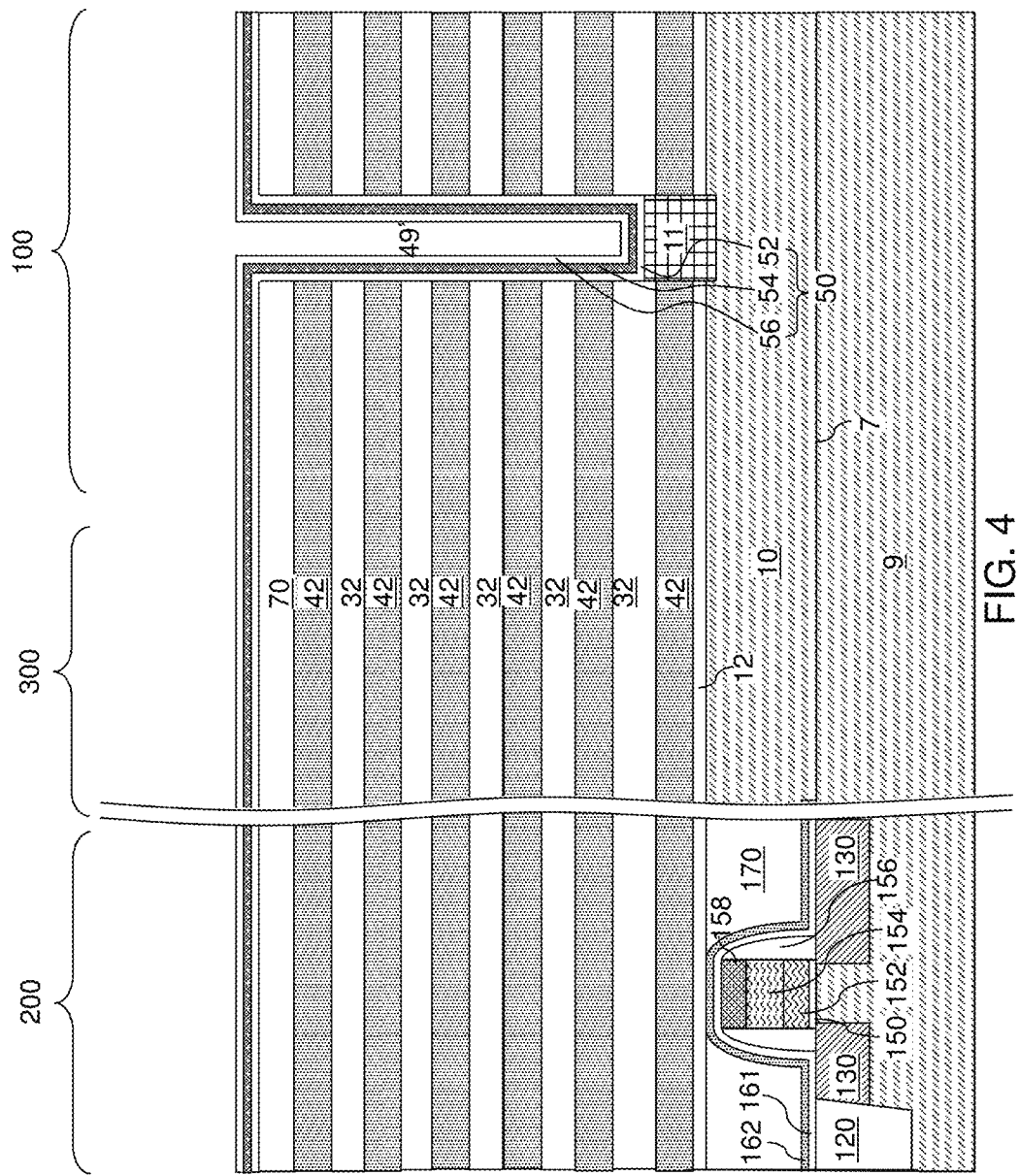
FIG. 4 is a vertical cross-sectional view of the exemplary structure after formation of a memory film according to an embodiment of the present disclosure.

Referring to FIG. 4, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

A blocking dielectric layer 52 and a charge trapping layer 54 can be sequentially deposited in the memory openings 49. The blocking dielectric layer 52 can include a single dielectric material layer or a layer stack of multiple dielectric material layers. The blocking dielectric layer 52 can be deposited on the sidewalls of each memory opening 49 by a conformal deposition method. The blocking dielectric layer 52 can be deposited, for example, by chemical vapor deposition (CVD), atomic layer deposition (ALD), pulsed laser deposition (PLD), liquid source misted chemical deposition, or a combination thereof. The thickness of the blocking dielectric layer 52 can be in a range from 1 nm to 20 nm, although lesser and greater thicknesses can also be employed. The blocking dielectric layer 52 can subsequently function as a dielectric material portion that blocks leakage of stored electrical charges to control gate electrodes.

In one embodiment, the blocking dielectric layer 52 includes a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. In one embodiment, the blocking dielectric layer 52 includes aluminum oxide.

Alternatively or additionally, the blocking dielectric layer 52 can include silicon oxide, silicon oxynitride, silicon nitride, or a combination thereof. In one embodiment, the blocking dielectric layer 52 can include silicon oxide. The blocking dielectric layer 52 can be formed by a conformal deposition method such as low pressure chemical vapor deposition, atomic layer deposition, or a combination thereof. The thickness of the blocking dielectric layer 52 can be in a range from 1 nm to 20 nm, although lesser and greater thicknesses can also be employed.

Subsequently, the charge trapping layer 54 can be deposited as a continuous material layer over the blocking dielectric layer 52. In one embodiment, the charge trapping layer 54 can be deposited as a conformal layer having a substantially same thickness throughout. As used herein, an element has a substantially same thickness throughout if the thickness of the element does not deviate from the average thickness of the element by more than 20% at all locations of the element. In one embodiment, the charge trapping layer 54 can be a charge trapping material including a dielectric charge trapping material, which can be, for example, silicon nitride. In one embodiment, the charge trapping layer 54 includes a silicon nitride layer.

The charge trapping layer 54 can be formed as a single charge trapping layer of homogeneous composition, or can include a stack of multiple charge trapping layers. The charge trapping layer 54 can be formed, for example, by chemical vapor deposition (CVD), atomic layer deposition (ALD), physical vapor deposition (PVD), or any suitable deposition technique for storing electrical charges therein. The thickness of the charge trapping layer 54 can be in a range from 2 nm to 20 nm, although lesser and greater final thicknesses can also be employed.

A tunneling dielectric layer 56 can be deposited on the physically exposed surfaces of the blocking dielectric layer 52 and the charge trapping layer 54. The tunneling dielectric layer 56 can be formed directly on the physically exposed inner sidewall of the upper portion of the blocking dielectric layer 52 and directly on a sidewall of the remaining lower portions of the charge trapping layer 54. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Figure 5:
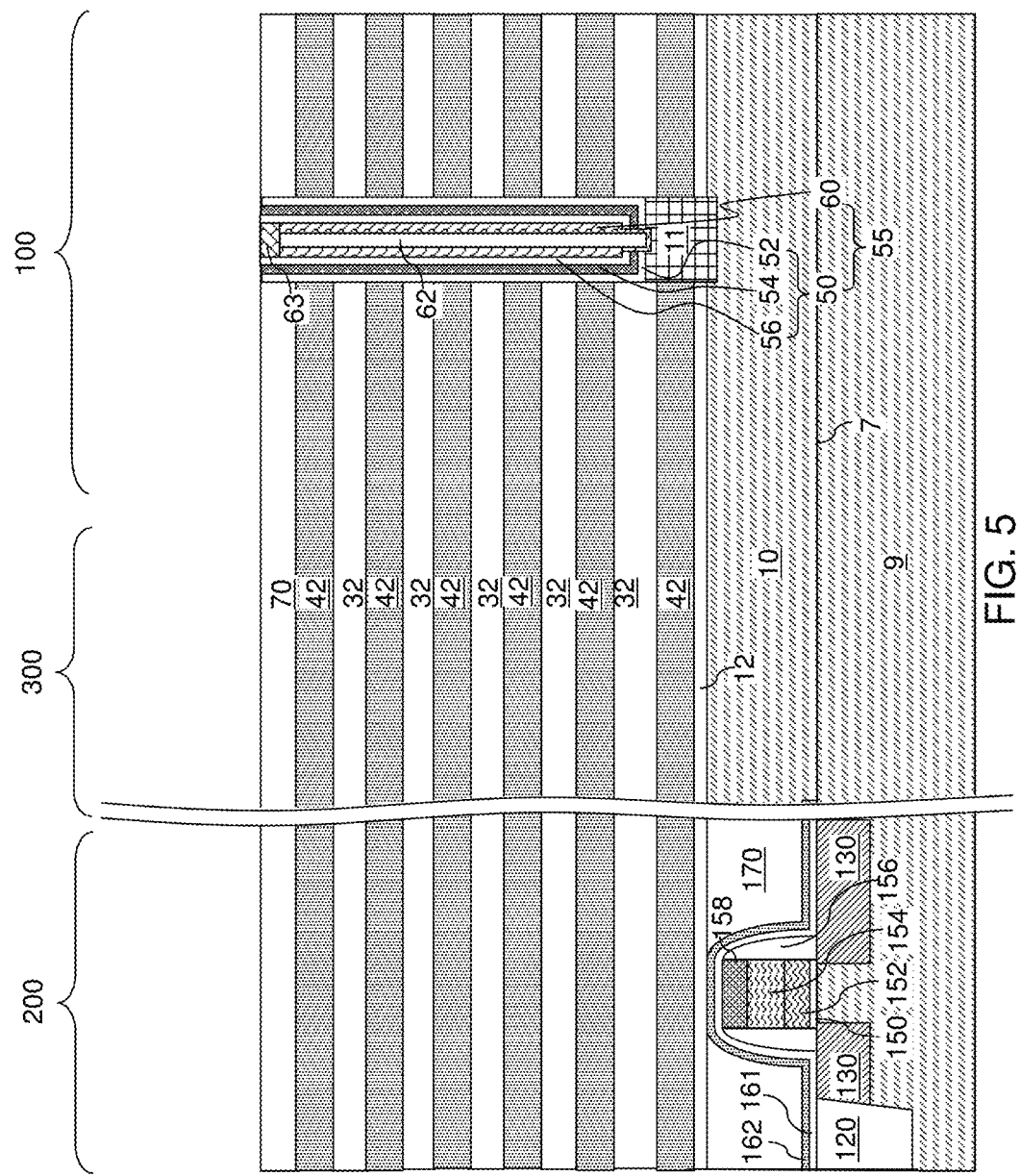
FIG. 5 is a vertical cross-sectional view of the exemplary structure after formation of memory stack structures according to an embodiment of the present disclosure.

Referring to FIG. 5, an optional first semiconductor channel layer can be formed on the tunneling dielectric layer 56. The first semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer includes amorphous silicon or polysilicon. The first semiconductor channel layer can be formed by a conformal deposition method such as low pressure chemical vapor deposition (LPCVD). The thickness of the first semiconductor channel layer can be in a range from 2 nm to 10 nm, although lesser and greater thicknesses can also be employed.

The optional first semiconductor channel layer, the tunneling dielectric layer 56, the charge trapping layer 54, the blocking dielectric layer 52 are sequentially anisotropically etched employing at least one anisotropic etch process. The portions of the first semiconductor channel layer, the tunneling dielectric layer 56, the charge trapping layer 54, and the blocking dielectric layer 52 located above the top surface of the insulating cap layer 70 can be removed by the at least one anisotropic etch process. Further, the horizontal portions of the first semiconductor channel layer, the tunneling dielectric layer 56, the charge trapping layer 54, and the blocking dielectric layer 52 at a bottom of each cavity 49' can be removed to form openings in remaining portions thereof.

Each remaining portion of the first semiconductor channel layer constitutes a first semiconductor channel portion. A surface of the epitaxial channel portion 11 can be physically exposed underneath the opening through the first semiconductor channel portion, the tunneling dielectric layer 56, the charge trapping layer 54, and the blocking dielectric layer 52. Optionally, the physically exposed portion of the epitaxial channel portion 11 can be vertically recessed. Each tunneling dielectric layer 56 is surrounded by a charge trapping layer 54.

Within each memory opening, a set of the tunneling dielectric layer 56, the charge trapping layer 54, and the blocking dielectric layer 52 collectively constitutes a memory film 50. In one embodiment, the first semiconductor channel portion, the tunneling dielectric layer 56, the charge trapping layer 54, and the blocking dielectric layer 52 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

A second semiconductor channel layer can be deposited directly on the semiconductor surface of the epitaxial channel portion 11 over the substrate (9, 10), and directly on the first semiconductor channel portion. The second semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer includes amorphous silicon or polysilicon. The second semiconductor channel layer can be formed by a conformal deposition method such as low pressure chemical vapor deposition (LPCVD). The thickness of the second semiconductor channel layer can be in a range from 2 nm to 10 nm, although lesser and greater thicknesses can also be employed. The second semiconductor channel layer may partially fill the cavity 49' in each memory opening, or may fully fill the cavity in each memory opening.

The materials of the first semiconductor channel portion and the second semiconductor channel layer are collectively referred to as a semiconductor channel material. In other words, the semiconductor channel material is a set of all semiconductor material in the first semiconductor channel portion and the second semiconductor channel layer.

In case the cavity 49' in each memory opening is not completely filled by the second semiconductor channel layer, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Referring to FIG. 5, the horizontal portion of the dielectric core layer above the insulating cap layer 70 can be removed, for example, by a recess etch from above the top surface of the insulating cap layer 70. Further, the horizontal portion of the second semiconductor channel layer located above the top surface of the insulating cap layer 70 can be removed by a planarization process, which can employ a recess etch or chemical mechanical planarization (CMP). Each remaining portion of the second semiconductor channel layer within a memory opening constitutes a second semiconductor channel portion.

Each adjoining pair of a first semiconductor channel portion and a second semiconductor channel portion can collectively form a vertical semiconductor channel 60 through which electrical current can flow when a vertical NAND device including the vertical semiconductor channel 60 is turned on. A tunneling dielectric layer 56 is surrounded by a charge trapping layer 54, and laterally surrounds a portion of the vertical semiconductor channel 60. Each adjoining set of a blocking dielectric layer 52, a charge trapping layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62. Each vertical semiconductor channel 60 is formed within a respective memory film 50. Each dielectric core 62 is formed inside a respective vertical semiconductor channel 60.

A drain region 63 can be formed at an upper end of the vertical semiconductor channel 60. The drain regions 63 can be formed by depositing a doped semiconductor material within each recessed region above the dielectric cores 62. The doped semiconductor material can be, for example, doped polysilicon formed by at least one of in-situ doping and ion implantation doping or a combination thereof. The highly doped drain regions near the drain side select gates provide a low resistive contact region for a bit line connection. Excess portions of the deposited semiconductor material can be removed from above the top surface of the insulating cap layer 70, for example, by chemical mechanical planarization (CMP) or a recess etch to form the drain regions 63.

Each set of a memory film 50 and a vertical semiconductor channel 60 in a same memory opening constitutes a memory stack structure 55. The memory stack structures 55 are formed through the in-process alternating stack of the insulating layers 32 and sacrificial material layers 42.

Figure 6:
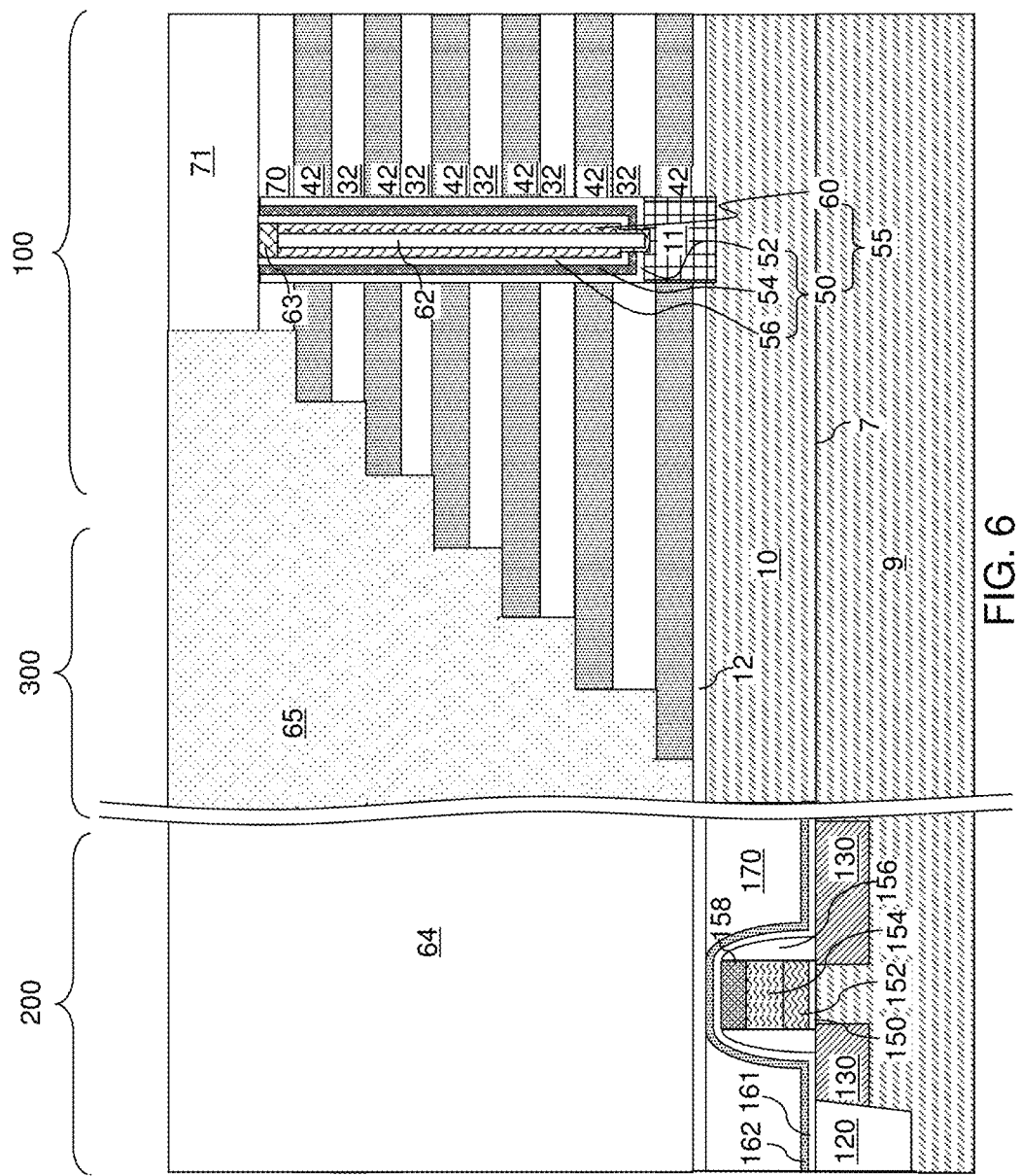
FIG. 6 is a vertical cross-sectional view of the exemplary structure after formation of a stepped terrace and a retro-stepped dielectric material portion according to an embodiment of the present disclosure.

Referring to FIG. 6, an optional first contact level dielectric material layer 71 can be formed over the substrate (9, 10). As an optional structure, the first contact level dielectric material layer 71 may, or may not, be formed. In case the first contact level dielectric material layer 71 is formed, the first contact level dielectric material layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric material layer 71 can be formed over a horizontal plane including the top surface of the insulating cap layer 70 and the top surfaces of the drain regions 63. The first contact level dielectric material layer 71 can be deposited by chemical vapor deposition, atomic layer deposition (ALD), spin-coating, or a combination thereof. The thickness of the first contact level dielectric material layer 71 can be in a range from 10 nm to 300 nm, although lesser and greater thicknesses can also be employed.

In one embodiment, the first contact level dielectric material layer 71 can be formed as a dielectric material layer having a uniform thickness throughout. The first contact level dielectric material layer 71 may be formed as a single dielectric material layer, or can be formed as a stack of a plurality of dielectric material layers. Alternatively, formation of the first contact level dielectric material layer 71 may be merged with formation of at least one line level dielectric material layer (not shown). While the present disclosure is described employing an embodiment in which the first contact level dielectric material layer 71 is a structure separate from an optional second contact level dielectric material layer or at least one line level dielectric material layer to be subsequently deposited, embodiments in which the first contact level dielectric material layer 71 and at least one line level dielectric material layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric material layer 71 by a planarization process such as chemical mechanical planarization and/or a recess etch. The top surfaces of the first contact level dielectric material layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric material layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 7A:
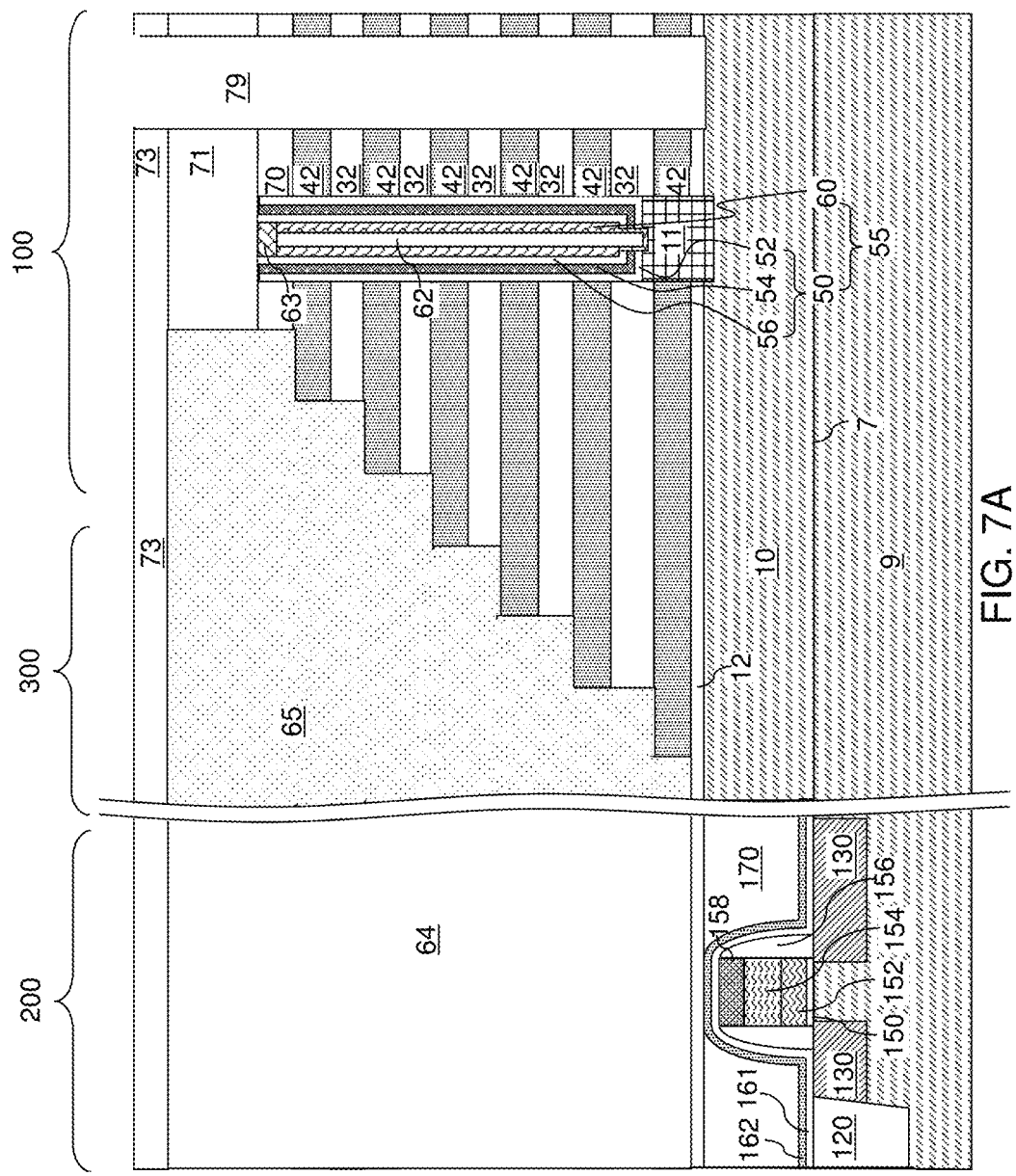
FIG. 7A is a vertical cross-sectional view of the exemplary structure after formation of a backside trench according to an embodiment of the present disclosure.
Figure 7B:
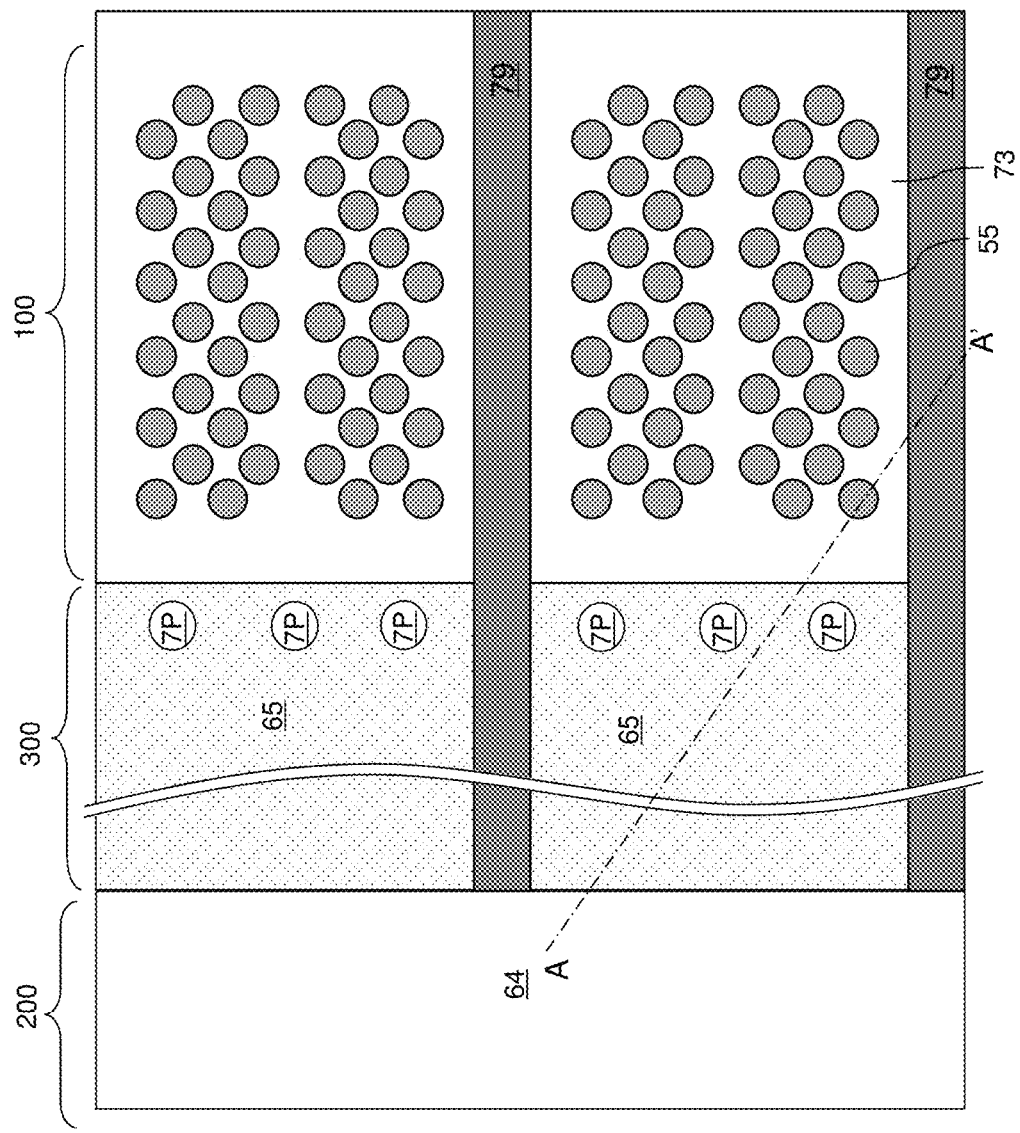
FIG. 7B is a partial see-through top-down view of the exemplary structure of FIG. 7A. The vertical plane A-A' is the plane of the vertical cross-sectional view of FIG. 7A.

Referring to FIGS. 7A and 7B, at least one dielectric support pillar 7P may be optionally formed through the retro-stepped dielectric material portion 65 and/or through the first contact level dielectric material layer 71 and/or through the alternating stack (32, 42). The plane A-A' in FIG. 7B corresponds to the plane of the vertical cross-sectional view of FIG. 7A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric material layer 71 concurrently with deposition of the at least one dielectric support pillar 7P can be present over the first contact level dielectric material layer 71 as a second contact level dielectric material layer 73. Each of the at least one dielectric support pillar 7P and the second contact level dielectric material layer 73 is an optional structure. As such, the second contact level dielectric material layer 73 may, or may not, be present over the insulating cap layer 70 and the retro-stepped dielectric material portion 65. The first contact level dielectric material layer 71 and the second contact level dielectric material layer 73 are herein collectively referred to as at least one contact level dielectric material layer (71, 73). In one embodiment, the at least one contact level dielectric material layer (71, 73) can include both the first and second contact level dielectric material layers (71, 73), and optionally include any additional via level dielectric material layer that can be subsequently formed. In another embodiment, the at least one contact level dielectric material layer (71, 73) can include only the first contact level dielectric material layer 71 or the second contact level dielectric material layer 73, and optionally include any additional via level dielectric material layer that can be subsequently formed. Alternatively, formation of the first and second contact level dielectric material layers (71, 73) may be omitted, and at least one via level dielectric material layer may be subsequently formed, i.e., after formation of a substrate contact via structure.

The second contact level dielectric material layer 73 and the at least one dielectric support pillar 7P can be formed as a single continuous structure of integral construction, i.e., without any material interface therebetween. In another embodiment, the portion of the dielectric material that is deposited over the first contact level dielectric material layer 71 concurrently with deposition of the at least one dielectric support pillar 7P can be removed, for example, by chemical mechanical planarization or a recess etch. In this case, the second contact level dielectric material layer 73 is not present, and the top surface of the first contact level dielectric material layer 71 can be physically exposed.

A photoresist layer (not shown) can be applied over the alternating stack (32, 42) and/or the retro-stepped dielectric material portion 65, and lithographically patterned to form at least one trench. Each of the at least one trench is herein referred to as a backside trench 79, i.e., a trench that is located in a different region than the memory stack structures 55 that are formed in the memory openings (which are referred to as front side openings). Each backside trench 79 can be formed in an area in which formation of a substrate contact via structure is desired. The trench 79 may extend through region 100 or through both regions 100 and 300. The pattern in the photoresist layer can be transferred through the alternating stack (32, 42) and/or the retro-stepped dielectric material portion 65 employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Figure 8:
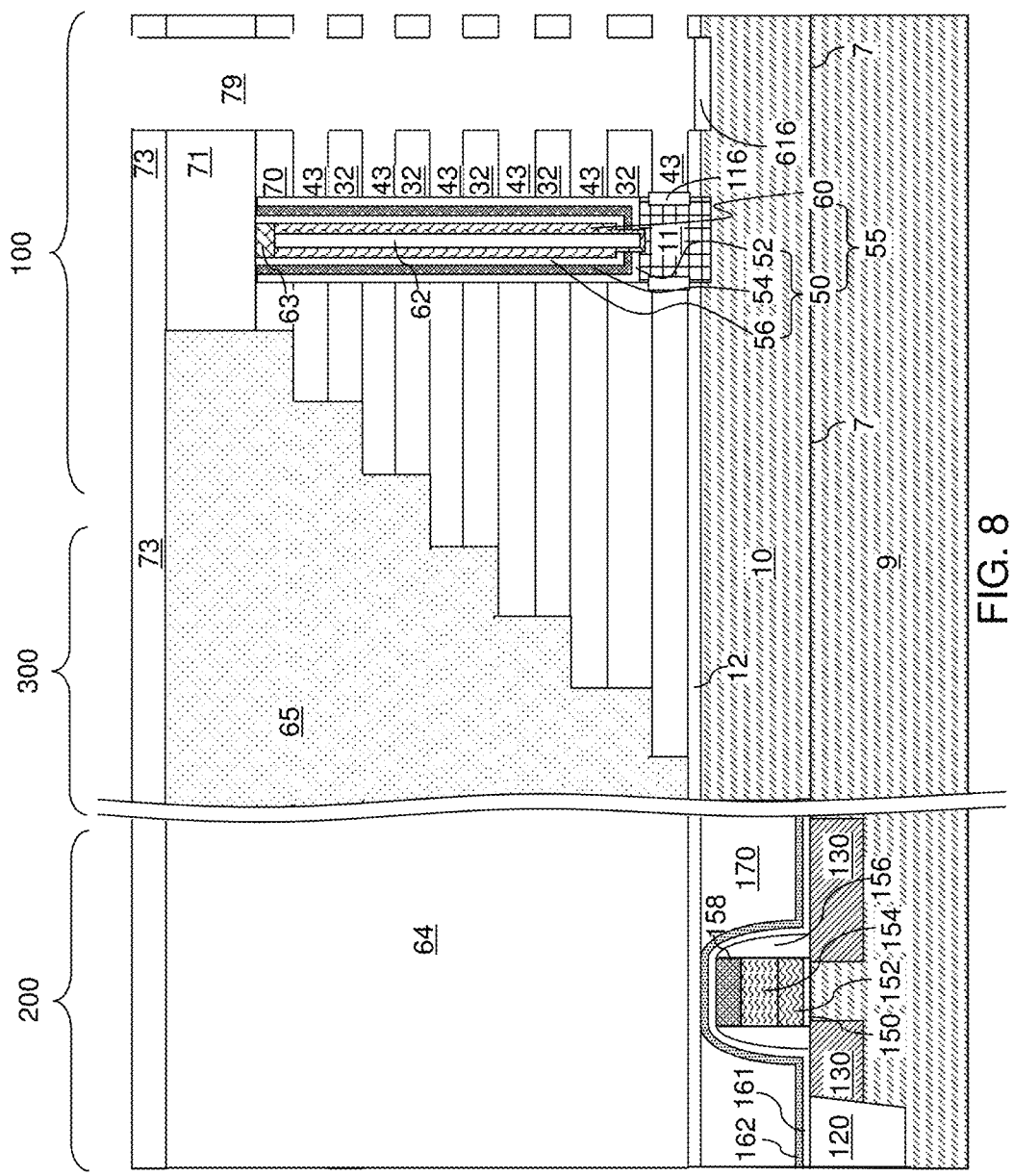
FIG. 8 is a vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced through the at least one backside trench 79, for example, employing an etch process. Backside recesses 43 are formed in volumes from which the sacrificial material layers 42 are removed.

The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the gate dielectric layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 9:
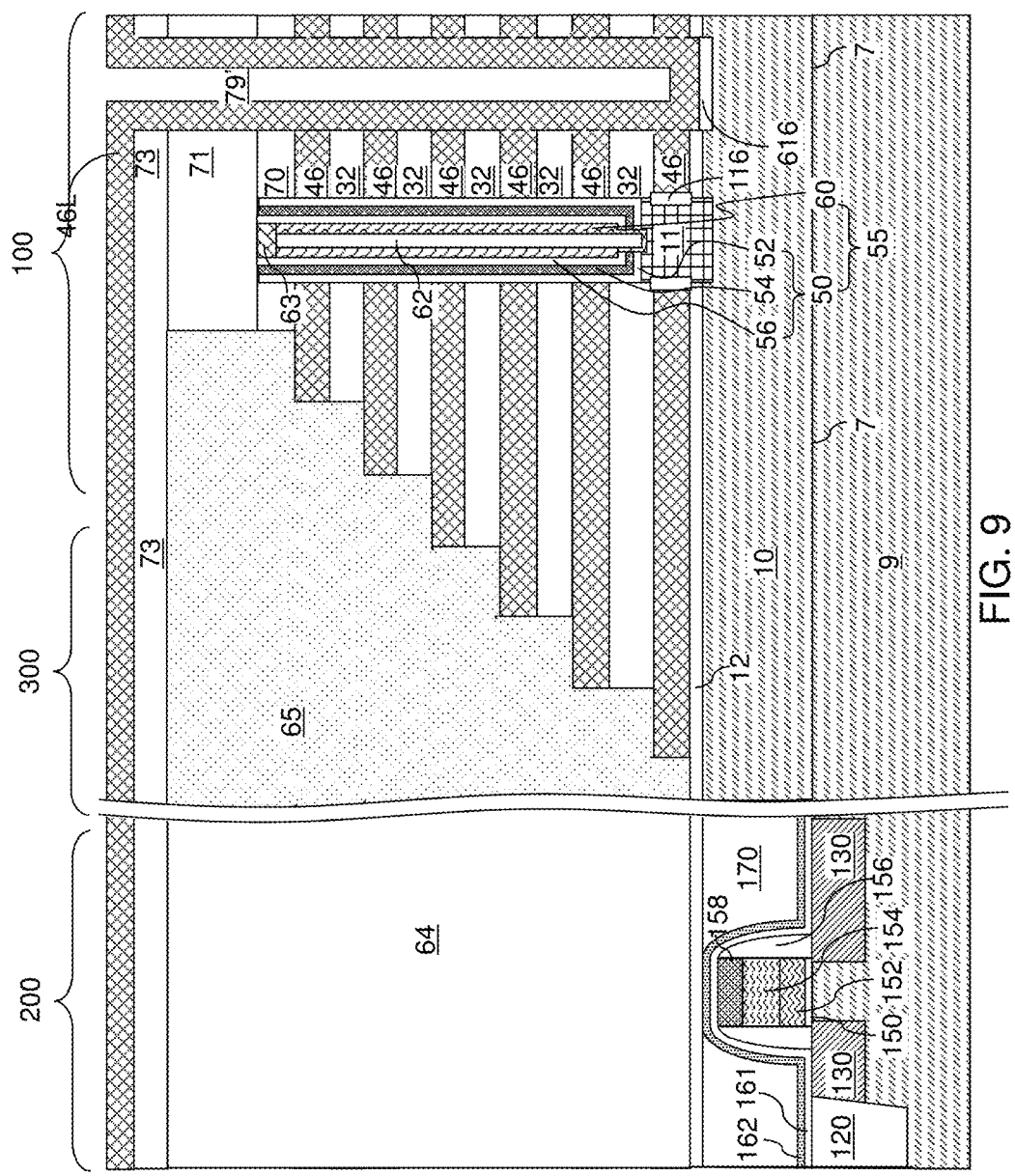
FIG. 9 is a vertical cross-sectional view of the exemplary structure after formation of electrically conductive layers according to an embodiment of the present disclosure.

Referring to FIG. 9, a backside blocking dielectric layer (not shown) can be optionally formed. The backside blocking dielectric layer, if present, comprises a dielectric material that functions as a control gate dielectric for the control gates to be subsequently formed in the backside recesses 43. In case a blocking dielectric layer 52 is present within each memory opening, the backside blocking dielectric layer is optional. In case a blocking dielectric layer 52 is omitted, the backside blocking dielectric layer is present.

At least one metallic material can be deposited in the plurality of backside recesses 43, on the sidewalls of the at least one the backside trench 79, and over the top surface of the second contact level dielectric material layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a continuous metallic material layer 46L can be formed on the sidewalls of each backside trench 79 and over the at least one contact level dielectric material layer (71,73). Thus, each sacrificial material layer 42 can be replaced with an electrically conductive layer 46. A backside cavity 79' is present in the portion of each backside trench 79 that is not filled with the backside blocking dielectric layer 66 and the continuous metallic material layer 46L.

Figure 10:
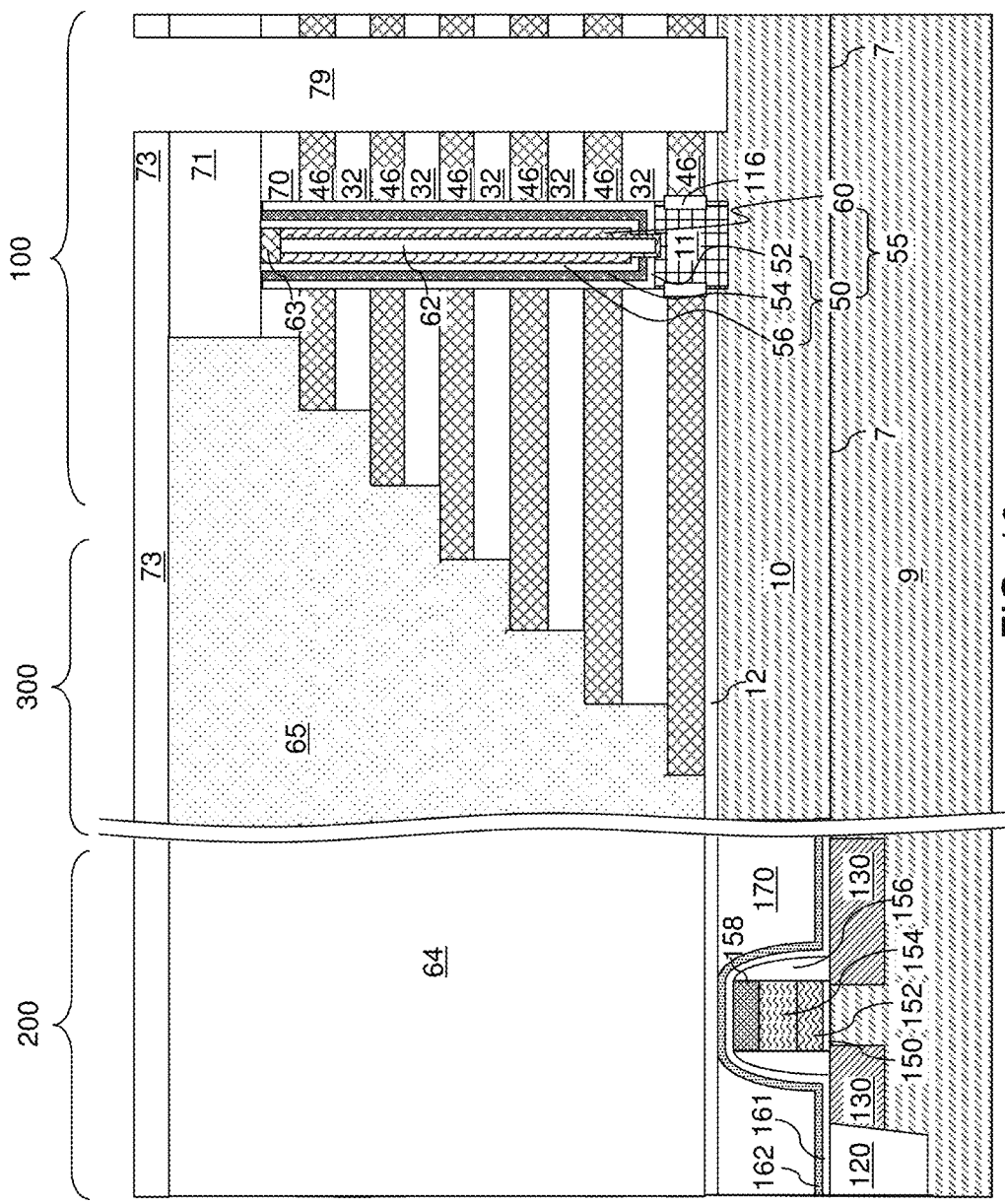
FIG. 10 is a vertical cross-sectional view of the exemplary structure after removal of a deposited conductive material from within the backside trench according to an embodiment of the present disclosure.

Referring to FIG. 10, the deposited metallic material of the continuous metallic material layer 46L is etched back from the sidewalls of each backside trench 79 and from above the second contact level dielectric material layer 73, for example, by an isotropic wet etch or dry etch or the combination of isotropic wet etch and dry etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the semiconductor material layer 10 during the last processing step of the anisotropic etch.

In one embodiment, the spacer material layers in the initial alternating stack can include sacrificial material layers 42, and the sacrificial material layers 42 can be replaced with electrically conductive layers 46. In this case, the in-process alternating stack of the insulating layers 32 and sacrificial material layers 42 is modified during the processing steps of FIGS. 8-10 to form an alternating stack of the insulating layer 32 and the electrically conductive layers 46. In one embodiment, the remaining portions of the charge trapping layer 54 comprises charge storage regions for a NAND string.

Alternatively, the spacer material layers can be formed as electrically conductive layers 46. In this case, the epitaxial channel portions 11 can be omitted, or can be formed to a lesser height, to avoid electrical shorts with the electrically conductive layers 46, and the processing steps of FIGS. 8-10 can be omitted.

Figure 11:
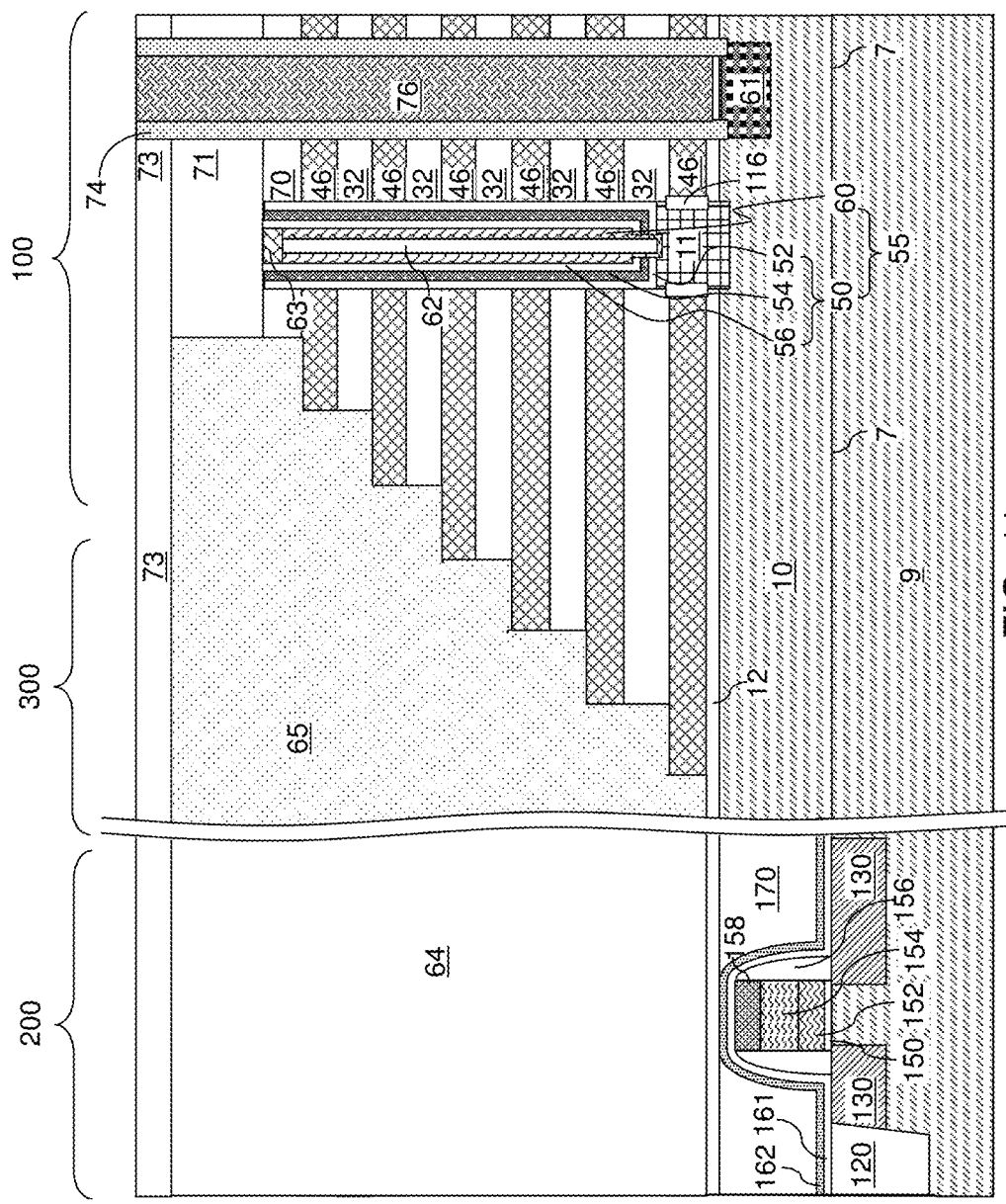
FIG. 11 is a vertical cross-sectional view of the exemplary structure after formation of insulating spacers and backside contact structures according to an embodiment of the present disclosure.

Referring to FIG. 11, a source region 61 can be formed in a surface portion of the substrate (e.g., in the semiconductor material layer 10) underneath each backside trench 79. Each source region 61 can be formed by implanting electrical dopants through each backside trench 79 into a semiconductor portion located on, or within, the substrate (9, 10). For example, a source region 61 may be formed by implantation of dopant atoms into a portion of the semiconductor material layer 10 through each backside trench 79. Alternatively, a source region 61 can be formed on the substrate (9, 10) as a doped semiconductor portion by deposition of a semiconductor material, for example, by selective epitaxy, and by implantation of electrical dopants into the deposited semiconductor portion.

An insulating material layer 74 can be deposited by a conformal deposition process such as a chemical vapor deposition process. The insulating material layer includes a dielectric material such as silicon oxide, silicon nitride, silicon oxynitride, or a combination thereof. In one embodiment, the insulating material can include undoped silicate glass (USG). The thickness of the insulating material layer can be in a range from 3 nm to 30 nm, although lesser and greater thicknesses can also be employed.

An anisotropic etch can be performed to remove horizontal portions of the insulating material layer from above the at least one contact level dielectric material layer (71, 73) and from a bottom portion of each backside trench 79. The anisotropic etch can be a reactive ion etch that etches the dielectric material of the insulating material layer selective to the aluminum oxide material of the continuous conformal aluminum oxide layer. In one embodiment, the reactive ion etch can employ at least one fluorocarbon etchant such as $CF_4$ and/or $CHF_3$, and optionally oxygen. Such fluorocarbon-based reactive ion etch chemistries are generally selective to aluminum oxide. Each remaining portion of the insulating material layer constitutes an insulating spacer 74.

In case a portion of the backside trench 79 has a substantially rectangular horizontal cross-sectional area, the insulating spacer 74 can have a pair of parallel vertical portions laterally spaced from each other by a uniform distance. Further, each parallel vertical portion of the insulating spacer 74 can have a uniform lateral thickness at a bottom portion and a middle portion. The anisotropic etch can cause formation of tapers at the top portion of each insulating spacer 74. In this case, each insulating spacer 74 can have a tapered profile at a top portion. In other words, the lateral thickness of each insulating spacer 74 can decrease with a vertical distance from the top surface of the substrate (9, 10).

At least one conductive material can be deposited to fill each backside cavity laterally surrounded by a respective insulating spacer 74. The at least one conductive material can include, for example, a combination of a conductive metallic nitride (such as TiN, TaN, or WN) that can be employed to form a conductive diffusion barrier layer, and a conductive fill material (such as W, Cu, Al, Ru, Co, and/or a heavily doped conductive semiconductor material). The at least one conductive material can be deposited by physical vapor deposition (PVD), chemical vapor deposition (CVD), electroplating, electroless plating, or a combination thereof. Excess portions of the at least one conductive material can be removed from above the top surface of the at least one contact level dielectric material layer (71, 73) by a planarization process, which may employ a recess etch or chemical mechanical planarization (CMP). A contact via structure is formed within each backside trench 79, which is herein referred to as a substrate contact via structure 76. Each substrate contact via structure 76 can physically contact a portion of the substrate (9, 10, 61) such as a source region 61 of the substrate. In this case, the substrate contact via structure 76 can be a source contact via structure that can be employed to apply electrical bias to a respective source region 61.

Figure 12A:
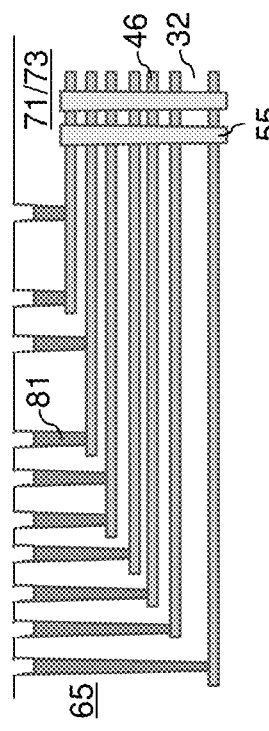

Referring to FIG. 12A, contact via cavities 69 can be formed over the stepped surfaces of the electrically conductive layers 46, for example, by application of a photoresist layer, lithographic patterning of the photoresist layer with openings that overlie the terraces of the electrically conductive layers, and transferring the pattern of the photoresist layer through the retro-stepped dielectric material portion 65 onto top surfaces of the terraces of the electrically conductive layers 46. Via cavities having various heights can be formed through the retro-stepped dielectric material layer 65. The via cavities are herein referred to as conductive line contact via cavities 69.

Figure 12B:
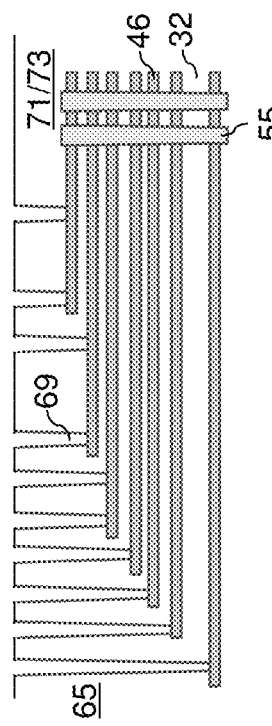

Referring to FIG. 12B, at least one conductive material can be deposited in the conductive line contact via cavities 69. The at least one conductive material can include at least one doped semiconductor material or at least one metallic material. Excess portions of the at least one conductive material above a horizontal plane including a topmost surface of the at least one contact level dielectric material layer (71, 73) can be removed by a planarization process, which can employ a recess etch and/or chemical mechanical planarization. In case the at least one conductive material includes a doped semiconductor, then it may comprise heavily doped polysilicon of a first conductivity type (e.g., n-type or p-type) having a dopant concentration of $1.0\times10^{19}/cm^3$ to $2.0\times10^{21}/cm^3$. In case the at least one conductive material includes at least one metallic material, then it may comprise a combination of a conductive metallic liner such as TiN, TaN, or WN and a conductive fill material such as W. The at least one conductive material may be vertically recessed within the word line contact via trenches so that remaining portions of the at least one conductive material have top surfaces that are recessed from the topmost surface of the at least one contact level dielectric material layer (71, 73). Each remaining portion of the at least one conductive material in the conductive line contact via cavities constitutes a contact via structure 81. Each contact via structure 81 can be formed directly on respective top surfaces of the electrically conductive layers 46 in a terrace region in which the electrically conductive layers 46 horizontally extend with different lateral extents. The contact via structures 81 that contact the electrically conductive layers 46 that function as word lines constitute word line contact via structures. The contact via structures 81 that contact the electrically conductive layers 46 that function as drain select gate electrodes constitute drain select gate contact via structures. The contact via structures 81 that contact the electrically conductive layers 46 that function as source select gate electrodes constitute source select gate contact via structures. The top surfaces of the contact via structures 81 can be recessed from the topmost surface of the at least one contact level dielectric material layer (71, 73) by a vertical recess distance, which can be in a range from 20 nm to 100 nm, although lesser and greater vertical recess distances can also be employed.

Figure 12C:
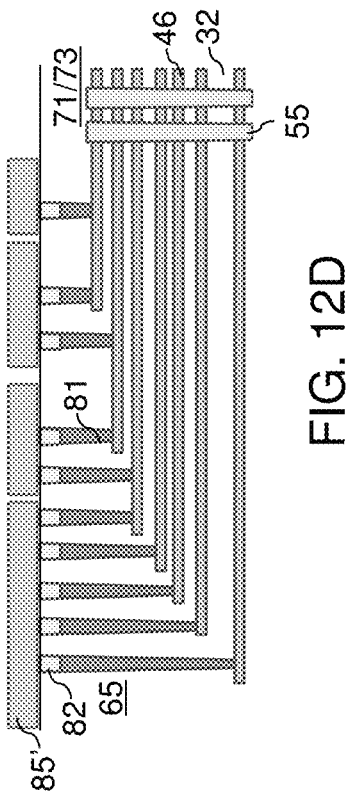

Referring to FIG. 12C, a doped semiconductor material including electrical dopants can be deposited in the recesses above the contact via structures 81, for example, by chemical vapor deposition. The doped semiconductor material can have a p-type doping or an n-type doping. The dopant concentration in the doped semiconductor material can be in a range from $1.0\times10^{16}/cm^3$ to $2.0\times10^{21}/cm^3$, although lesser and greater dopant concentrations can also be employed. The electrical dopants can be introduced into the deposited semiconductor material by in-situ doping or by implantation of the electrical dopants by ion implantation or by plasma doping into intrinsic semiconductor material. Excess portions of the doped semiconductor material can be removed from above the horizontal plane including the topmost surface of the at least one contact level dielectric material layer (71, 73) by a planarization process such as chemical mechanical planarization. Each remaining portion of the doped semiconductor material constitutes a lower active region 82 for a vertical field effect transistor. The lower active region may be at least a portion of a source region or a drain region. For example, if the contact via structures 81 comprise heavily doped polysilicon of a first conductivity type, then the lower active region may 82 may comprise a lightly doped polysilicon of the first conductivity type having a dopant concentration of $1.0 \times 10^{16}/cm^3$ to $1.0 \times 10^{18}/cm^3$ to form a so-called "low doped drain" (LDD) source or drain structure (81, 82). Each lower active region 82 can be formed within recesses of the via cavities that overlie the contact via structures 81. In one embodiment, the doped semiconductor material comprises doped polysilicon, which may be deposited as polycrystalline material or deposited as an amorphous material and subsequently annealed to become polycrystalline.

In an alternative embodiment, the at least one conductive material employed to form the contact via structures 81 may include a doped semiconductor material. In this case, contact via structures 81 and the lower active regions 82 can be formed as integral structures employing a same deposition and planarization process. In other words, each of the conductive line contact via cavities 69 can be filled with a doped semiconductor material, and excess portions of the doped semiconductor material may be removed from above the horizontal plane including the topmost surface of the at least one contact level dielectric material layer (71, 73). Each remaining portion of the deposited doped semiconductor material can constitute a single doped semiconductor material portion that functions as a combination of a contact structure 81 and a lower active region 82.

Figure 12D:
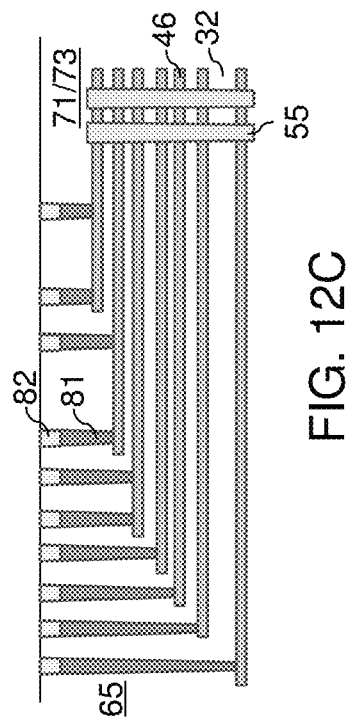

Referring to FIG. 12D, patterned conductive material portions can be formed over the lower active regions 82 by depositing and patterning a conductive material layer. The conductive material layer can include a doped semiconductor material such as doped amorphous silicon or doped polysilicon. The thickness of the conductive material layer is selected to be about the target gate length of the field effect transistors to be formed. For example, the thickness of the conductive material layer can be in a range from 20 nm to 200 nm, although lesser and greater thicknesses can also be employed. The conductive material layer is patterned into discrete conductive material portions to form conductive material portions 85'. The conductive material portions 85' are in-process structures that are subsequently patterned further into gate electrodes. The conductive material portions 85' can contact, and cover, the entire top surfaces of the lower active regions 82. The conductive material portions 85' are formed over the retro-stepped dielectric material portion 65. The contact via structures 81 extend through the portion 65. An optional insulating layer (e.g., silicon oxide layer, not shown) may be formed between layer 73 and portions 85' to prevent a short circuit between portions 82 (e.g., source or drain) and 85' (e.g., gate).

Figure 12E:
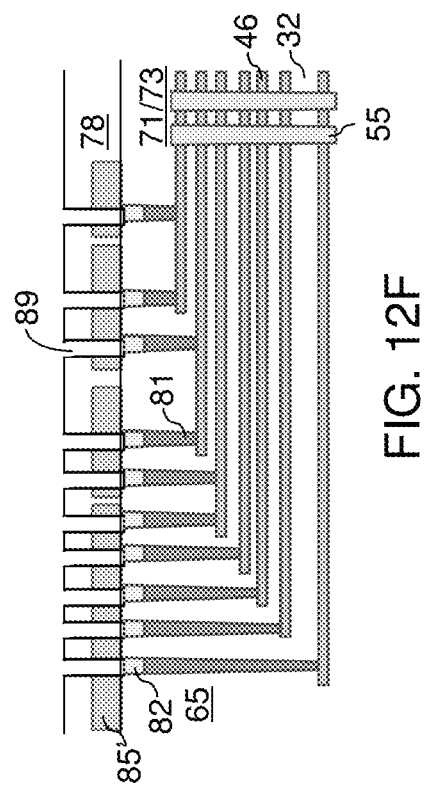

Referring to FIG. 12E, a dielectric material layer can be formed over the conductive material portions 85'. The dielectric material layer is herein referred to as a transistor level dielectric material layer 78 because the gate electrodes and upper active regions of vertical field effect transistor are subsequently formed within the transistor level dielectric material layer 78. The transistor level dielectric material layer 78 can include a dielectric material such as undoped silicate glass (i.e., silicon oxide), doped silicate glass, or organosilicate glass. Optionally, the top surface of the transistor level dielectric material layer 78 can be planarized, for example, by chemical mechanical planarization, or by employing a self-planarizing process for deposition of the dielectric material layer 78 (such as spin-coating). The thickness of the transistor level dielectric material layer 78, as measured above the top surfaces of the conductive material portions 85', can be in a range from 20 nm to 400 nm, although lesser and greater thicknesses can also be employed.

Figure 12F:
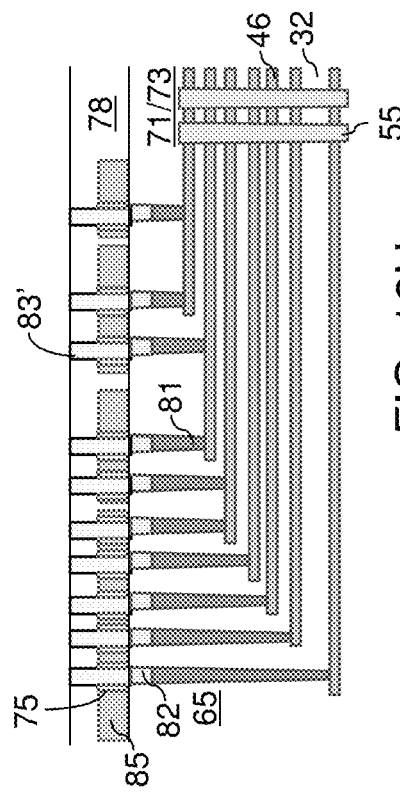

Referring to FIG. 12F, openings 89 are formed through regions of the transistor level dielectric material layer 78 and the conductive material portions 85' that overlie the contact via structures 81. For example, a photoresist layer (not shown) can be applied over the transistor level dielectric material layer 78 and lithographically patterned to form openings therein. The openings in the photoresist layer can overlap with the areas of the underlying lower active regions 82. The pattern of the openings in the photoresist layer can be transferred through the transistor level dielectric material layer 78 by an anisotropic etch that employs the patterned photoresist layer as an etch mask. Each opening 89 extends from the top surface of the transistor level dielectric material layer 78 to the bottom surfaces of the conductive material portions 85'. Each opening 89 is formed through a respective conductive material portion 85' in areas that overlie an underlying conductive via structure 82.

In one embodiment, the dimensions of the openings 89 are selected such that the areas of the openings 89 includes at least the entirety of the area of the top surface of the respective underlying lower active region 82. In one embodiment, the entire areas of the top surfaces of the lower active regions 82 can be physically exposed underneath the openings 89. Thus, each electrically conductive portion 85' can be electrically isolated from the lower active regions 82. The openings 89 can have substantially vertical sidewalls.

Figure 12G:
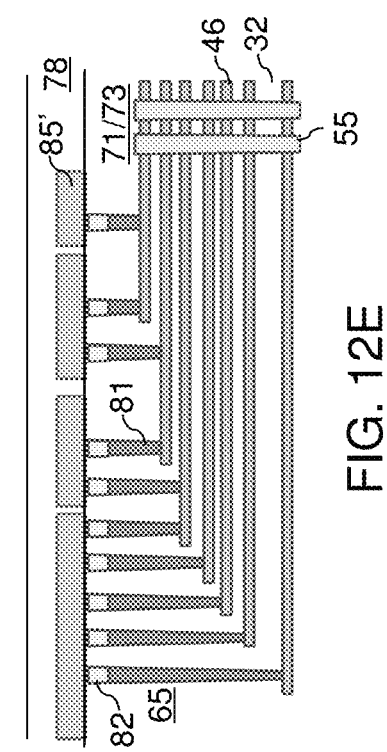

Referring to FIG. 12G, gate dielectrics 84 can be formed on the sidewalls of the openings 89 on the conductive material portions 85'. Each remaining portion of the conductive material portions 85' constitutes a gate electrode 85 for a respective vertical field effect transistor. One or more gate electrodes 85 can be employed as the common gate electrode for a subset of the vertical field effect transistors. In one embodiment, the conductive material portions 85' can include a doped semiconductor material (such as doped polysilicon or doped amorphous silicon), and the gate dielectrics 84 can be formed by conversion of surface portions of the conductive material portions 85' into a dielectric material. For example, thermal oxidation, thermal nitridation, plasma oxidation, and/or plasma nitridation of the surface portions of the doped semiconductor material of the conductive material portions 85' can be employed to form the gate dielectrics 84. Each gate dielectric 84 can be formed as an annular spacer (i.e., a ring-shaped spacer) having the same height as the height of the gate electrodes 85. As such, the gate dielectrics 84 are self-aligned to the gate electrodes 85, and can have top surfaces that are substantially coplanar (i.e., located within the same horizontal plane as) as the top surfaces of the gate electrodes 85, and can have bottom surfaces that are substantially coplanar as the bottom surfaces of the gate electrodes 85. Alternatively, the gate dielectric 84 may be deposited into the openings 89.

Figure 12H:
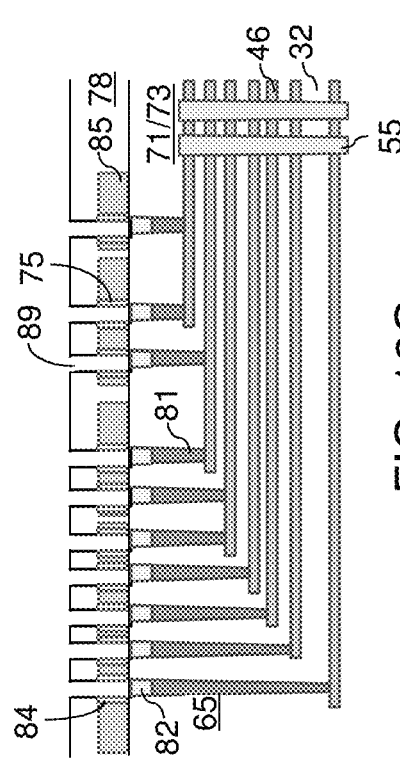

Referring to FIG. 12H, semiconductor fill material portions 83' can be formed within the openings 89 through the transistor level dielectric material layer 78 and the gate electrodes 85. The semiconductor fill material portions 83' are formed directly on the inner sidewalls of the gate dielectrics 84. The semiconductor fill material portions 83' can include an intrinsic semiconductor material or a lightly doped semiconductor material including dopants at a concentration less than $1.0 \times 10^{17}/cm^3$, although a greater dopant concentration may be employed in some cases. The dopants may be provided in-situ or implanted into the semiconductor material after deposition. In one embodiment, the conductivity type of the dopants in the semiconductor fill material portions 83' can be the opposite of the conductivity type of the dopants in the lower active regions 82. The semiconductor material of the semiconductor fill material portions 83' can be deposited by a conformal deposition process such as chemical vapor deposition. The semiconductor material of the semiconductor fill material portions 83' may be deposited as a polycrystalline semiconductor material, or may be deposited as an amorphous semiconductor material and subsequently annealed to be converted into a polycrystalline semiconductor material. Excess portions of the deposited semiconductor material can be removed from above a horizontal plane including the top surface of the transistor level dielectric material layer 78, for example, by chemical mechanical planarization.

Referring to FIG. 12I, optional doped extension regions 86 can be formed by implanting electrical dopants around, or within, regions of the semiconductor fill material portions 83' that are located above a first horizontal plane including the top surfaces of the gate electrodes 85 and below a second horizontal plane including the top surface of the transistor level dielectric material layer 78. The optional doped extension regions 86 can have a doping of the same conductivity type as the lower active regions 82, and can have the opposite type of doping from portions of the semiconductor fill material portions 83' located adjacent to the gate dielectric 84. Upper active regions 87 can be formed above the doped extension regions 86 such that each upper active region 87 adjoins an underlying doped extension region 86. Each region 87 may be heavily doped while each region 86 may be lightly doped to form the LDD structure of the source or drain. In case the doped extension regions 86 are not employed, the upper active regions 87 can extend from the first horizontal plane including the top surfaces of the gate electrodes 85 to the second horizontal plane including the top surface of the transistor level dielectric material layer 78. In one example, the upper active regions 87 may comprise N+ polysilicon drain regions, regions 86 may comprise N− polysilicon LDD drain regions, regions 83 may comprise P− polysilicon channel regions, regions 82 may comprise N− polysilicon LDD source regions and regions 81 may comprise vertical N+ polysilicon pillar source regions which contact the word lines or select gate electrodes 46.

Each portion of the semiconductor fill material portions 83' located adjacent to the gate dielectric 84 constitutes a semiconductor channel 83 of a respective vertical field effect transistor. In one embodiment, the lower active region 82 of a vertical field effect transistor can be a source region and the upper active region 87 of the vertical field effect transistor can be a drain region. In another embodiment, the lower active region 82 of a vertical field effect transistor can be a drain region and the upper active region 97 of the vertical field effect transistor can be a source region.

Referring to FIG. 12J, a via level dielectric material layer 90 can be formed over the transistor level dielectric material layer 78 by deposition of another dielectric material. The dielectric material of the via level dielectric material layer 90 can include, for example, silicon oxide, organosilicate glass, silicon nitride, and/or nitrogen-doped organosilicate glass. The thickness of the via level dielectric material layer 90 can be in a range from 100 nm to 500 nm, although lesser and greater thicknesses can also be employed.

Various transistor contact via structures (881, 882, 887) can be formed through the via level dielectric material layer 90 to provide electrical contact to the upper active regions 87 of the vertical field effect transistors and to the gate electrodes 85 of the field effect transistors. Further, drain contact via structures 885 can be formed through the via level dielectric material layer 90, the transistor level dielectric material layer 78, and the at least one contact level dielectric material layer (71, 73) to contact the drain regions 63 of the NAND strings 101 containing the memory stack structures 55.

Figure 13A:
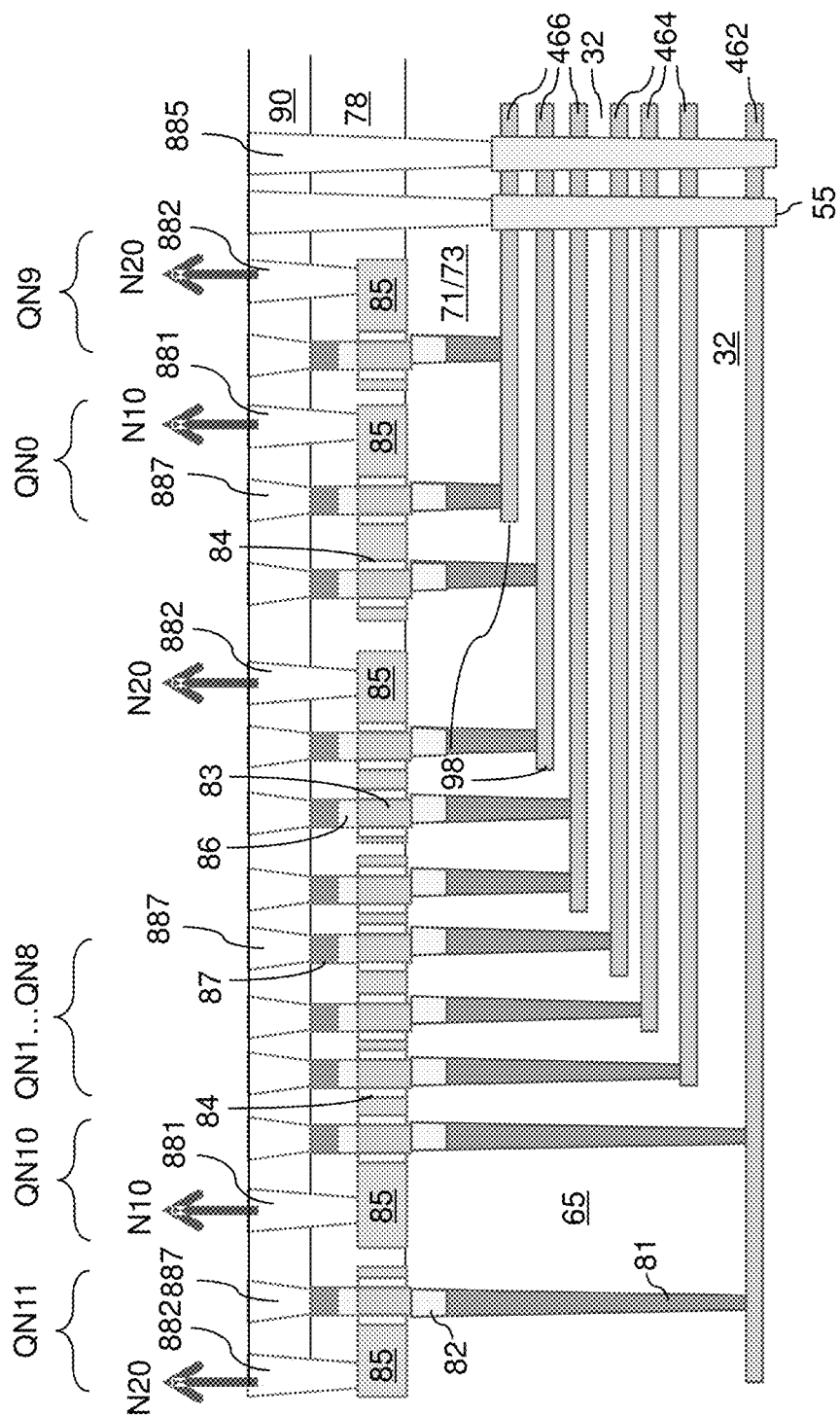
FIG. 13A is a magnified vertical cross-sectional view of the region of the exemplary structure illustrated in FIG. 12J.
Figure 13B:
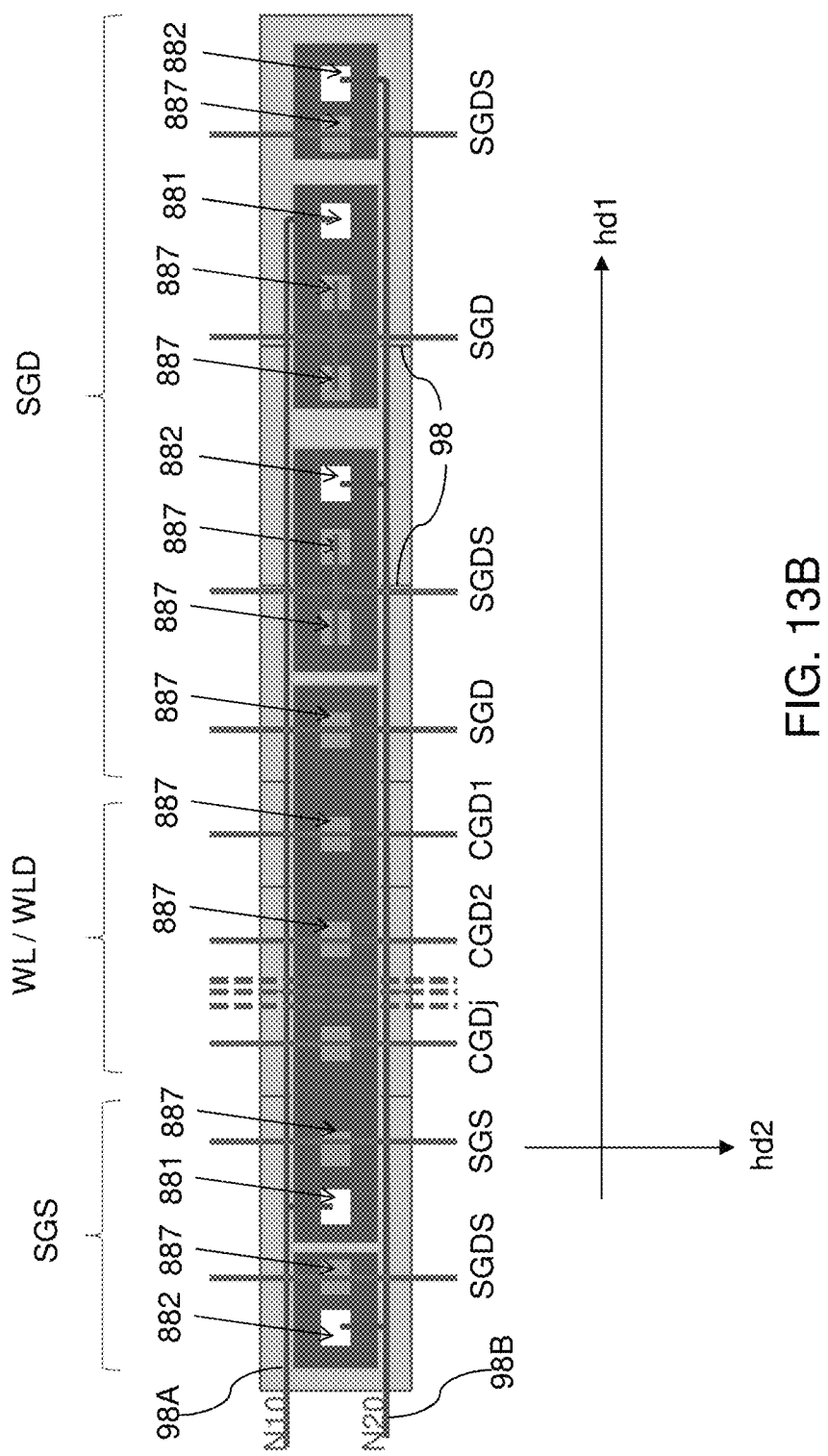
FIG. 13B is a top-down view of the region of the exemplary structure of FIG. 13A.

Referring to FIGS. 13A and 13B and FIG. 1 collectively, an exemplary wiring scheme for the various transistor contact via structures (881, 882, 887) is illustrated. Two level shifter output nodes N10 and N20 can be connected to the various input nodes of the vertical field effect transistors. In this case, two metal lines 98A, 98B that extend along a first horizontal direction hd1 can be provided over the vertical field effect transistors at a bit line level, or at a line level above the bit line level. The two metal lines 98A, 98B can be a pair of bus lines that transmit the output signals from the two respective output nodes N10 and N20 of the level shifter circuitry 54A to the gate electrodes 85 of a subset of the vertical field effect transistors. Thus, each gate electrode 85 of the subset of the vertical field effect transistors can be electrically biased by a respective signal provided by one of two metal lines 98. First-type transistor contact via structures 881 can be a set of gate contact via structures connected to line 98A to transmit a first output signal N10 from the level shifter circuitry to first type gate electrodes 85 of switching transistors QN0 to QN8 and QN10, and second-type transistor contact via structures 882 can be a set of the gate contact via structures connected to line 98B to transmit a second output signal N20 from the level shifter circuitry to second type gate electrodes 85 of transistors QN9 and QN11. Active region contact via structures 887 can be employed to provide electrical signals to the upper active regions 87 of the vertical field effect transistors.

Additional metal lines can be formed, which extend along a second horizontal direction hd2 that is different from the first horizontal direction hd1. Each upper active region 87 of the vertical field effect transistors can be electrically shorted to a respective additional metal line. The additional metal lines can be electrically shorted to the various nodes CGDj, SGS, SGD, and SGDS illustrated in FIG. 1.

In one embodiment, the electrically conductive layers 46 can form stepped surfaces that extend along a first horizontal direction hd1 with different lateral extents. The edge 98 of each stepped surface (i.e., the edge of each terrace) of layer 46 is shown by a partial line in FIG. 13B. Each gate electrode 85 of the vertical field effect transistors can be electrically biased by a respective signal from nodes N10 or N20 provided by one of two metal lines 98A, 98B that extend along the first horizontal direction hd1. In one embodiment, each upper active region 87 of the vertical field effect transistors can be biased by metal lines that extend along a second horizontal direction hd2 that is different from the first horizontal direction hd1.

According to various embodiments of the present disclosure, a memory device is provided, which comprises an alternating stack of insulating layers 32 and electrically conductive layers 46 located over a substrate (9, 10); a memory stack structure 55 extending through the alternating stack and including a memory film 50 and a vertical semiconductor channel 60; contact via structures 81 in contact with a respective electrically conductive layer 46; and vertical field effect transistors including a bottom active region 82 overlying a respective contact via structure 81.

In one embodiment, a subset of the vertical field effect transistors can comprise a common gate electrode 85. In one embodiment, each of the subset of the vertical field effect transistors can comprise a cylindrical gate dielectric 84 contacting a respective inner sidewall of the common gate electrode 85 and enclosing a transistor channel 83. In one embodiment, the common gate electrode 85 can comprises a semiconductor material and electrical dopant atoms, and each of the vertical field effect transistors can comprise a gate dielectric 84 including a dielectric oxide of the semiconductor material.

In one embodiment, an insulating cap layer 70 and contact level dielectric layer(s) (71, 73) can overlie the alternating stack (32, 46). Each of the vertical field effect transistors can have an interface between a respective transistor channel 83 and a respective lower active region 82 within the horizontal plane including the top surface of the contact level dielectric layer(s) (71, 73). A transistor level dielectric material layer 78 can be provided, which laterally surrounds, and overlies, gate electrodes 85 of the vertical field effect transistors. A via level dielectric material layer 90 can be provided, which overlies the transistor level dielectric material layer 78 and through which transistor contact via structures (881, 882, 887) extend.

In one embodiment, each of the vertical field effect transistors can comprise a transistor channel 83 that is self-aligned to a respective upper active region 87 thereof. In one embodiment, the transistor channel 83 and the overlying upper active region 87 can have substantially the same horizontal cross-sectional areas at a same location. In one embodiment, at least one transistor channel 83 of the vertical field effect transistors may be laterally offset from a respective lower active region 82 due to overlay variations that can be present during the lithographic alignment of the pattern for the openings 89 through the gate electrodes 85 to the pattern of the lower active region 82.

In one embodiment, the electrically conductive layers 46 can comprise word lines 464 for memory elements within the memory stack structure 55. The vertical field effect transistors can comprise word line switches that control application of a bias voltage to the word lines 464. In one embodiment, the electrically conductive layers 46 can further comprise at least one select gate electrode (462, 466) that controls activation of the memory stack structure 55 of each NAND string 101. The at least one select gate electrode (462, 466) can include one or more source side select gate electrodes 462, and/or one or more drain side select gate electrodes 466. The vertical field effect transistors further comprise at least another select gate electrode switch (i.e., the vertical field effect transistors that are connected to the select gate electrodes (462, 466)) that controls application of another bias voltage to the select gate electrode.

Figure 14:
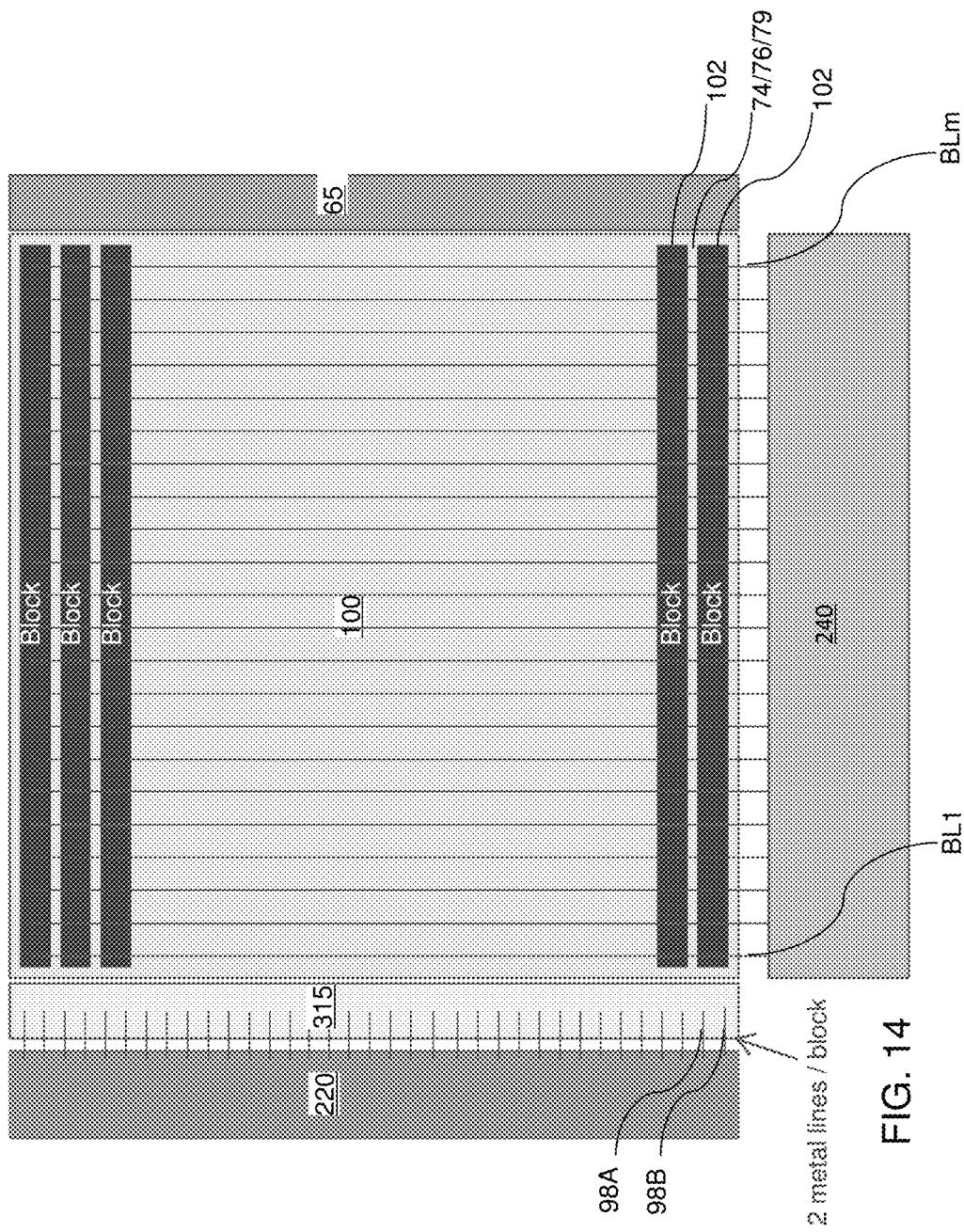
FIG. 14 is a first exemplary layout for implementing the vertical field effect transistors of the present disclosure.
Figure 15:
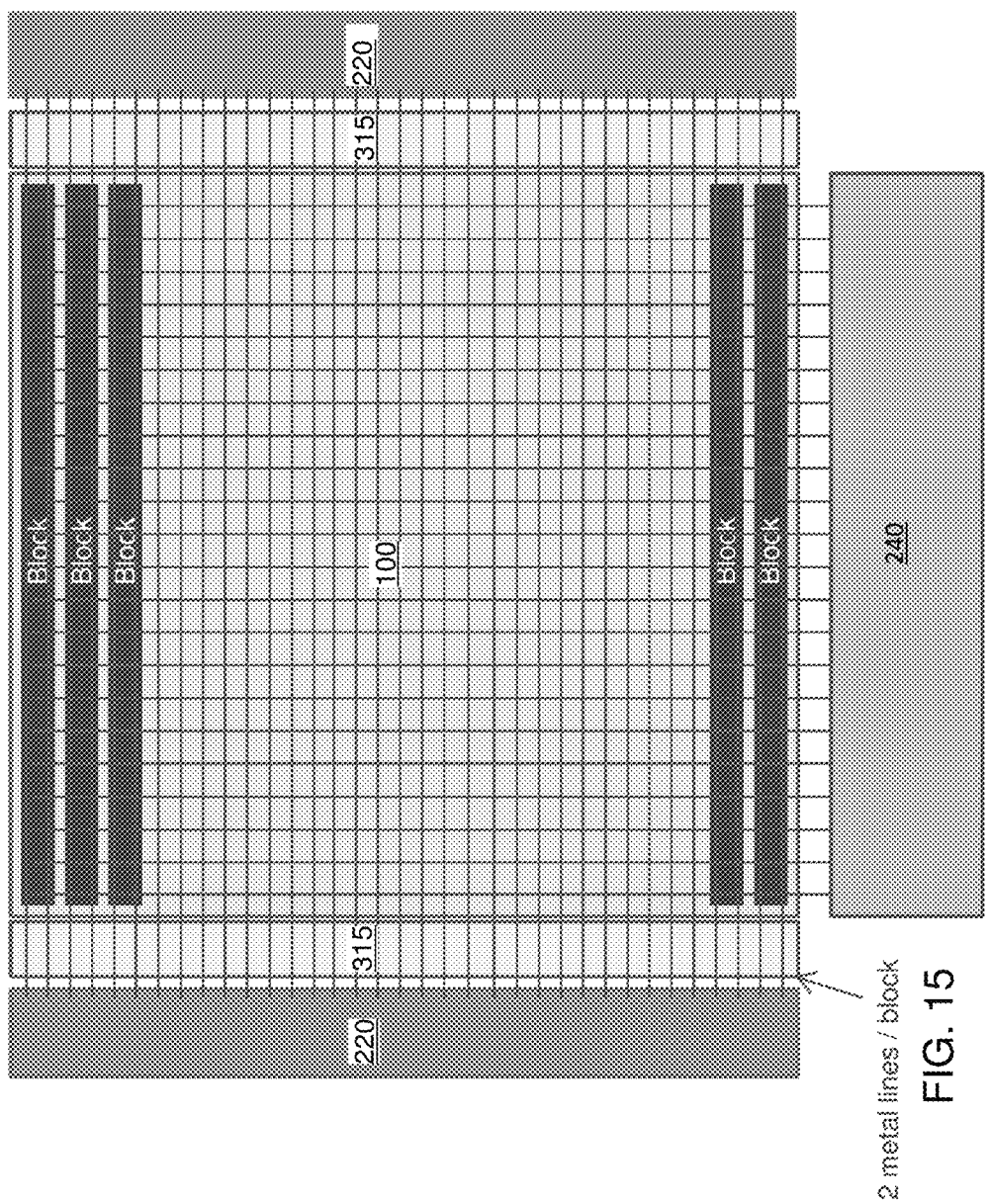
FIG. 15 is a second exemplary layout for implementing the vertical field effect transistors of the present disclosure.

Referring to FIGS. 14 and 15, exemplary layouts for a memory device for implementing the vertical field effect transistors of the present disclosure are illustrated. The memory device can include a memory element array 100, which can be a three-dimensional array of memory elements. The three-dimensional array can include a two-dimensional array of memory blocks 102 of vertical NAND strings 101, each including a vertical array of memory elements therein.

A memory block 102 includes common word lines and select gate electrodes for all NAND strings 101 in the block 102. Adjacent blocks 102 may be separated by the backside trench 79 which extends through the entire stack (32, 46) and separates all select gate electrodes and word lines of adjacent blocks or by a shallow trench which separates only one or more drain select electrodes of adjacent blocks. Thus, adjacent blocks 102 may share the same word lines and source select gate electrodes, but have different drain select gate electrodes.

At least one word line decoder including a substrate level peripheral device region 220 (e.g., containing the devices 201, such as CMOS devices, of the level shifter/data latch and/or other row driver circuitry in or on the substrate) and region of vertical word line switching field effect transistors 315 located in the stepped terraced contact region 300 are provided per memory element array 100. The word line decoder (220, 315) may be provided only on one side of the memory element array 100 as illustrated in FIG. 14, or can be provided on two opposing sides of the memory element array 100 as illustrated in FIG. 15. Alternatively, the vertical word line switching transistors 315 may be located on opposite row sides of the array 100, while the substrate level peripheral device region 220 may be located on only one side of the array 100. Two metal lines 98A, 98B can be provide per memory block 102 that shares the same set of source select and drain select gate electrodes to transmit a pair of output signals from nodes N10 and N20 of the level shifter circuitry 54A through the transistors 315 to the memory block. A bit line decoder 240 (e.g., sense amplifier) can be located on the column side of the memory element array 100. The bit lines BLi are connected to the bit line decoder 240. The bit lines extend perpendicular to the lines 98A, 98B, and to the word lines and select gate electrodes.

In one embodiment, the memory device of the embodiments of the present disclosure can include a monolithic three-dimensional NAND memory device. The electrically conductive layers 46 can include a first electrically conductive layer located at a first level and a second electrically conductive layer located at a second level that is different from the first level. The first and second electrically conductive layers can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

The embodiments of the present disclosure containing vertical thin film transistor word line switching transistors 315 located over the contact region 300 provide the following non-limiting advantages compared to prior art devices in which the entire word line decoder (including the word line and select gate switching transistors) is formed in or on the substrate.

First, the word line switching transistors 315 may be formed over the existing word line contact area 300 which reduces the die size and reduces device cost. Second, the memory block 102 size may be reduced because complex metal wiring having more than three metal lines is not required. Instead, two metal lines 98A, 98B which extend in the row direction (i.e., in the word line direction hd1) may be used per block 102. Thus, the metal layout becomes very relaxed (i.e., only metal lines 98A, 98B per block which connect to respective nodes N10, N20). The reduction in the number of metal lines increases the device reliability and speed and decreases the device manufacturing cost.

Since, metal lines are very relaxed (i.e., only two lines 98A, 98B may be used per memory block 102), both row sides of the memory array 100 may be connected to separate word line switching transistors 315 located on the opposite row sides of the memory array, as shown in FIG. 15. Thus, the word lines may be driven from both left and right side of the array. This configuration is approximately the same as a configuration where the word line length becomes half in terms of RC delay, which provides almost four times faster word line ramp speed with minimum impact on the die size.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   an alternating stack of insulating layers and electrically conductive layers located over a substrate, wherein the electrically conductive layers form stepped surfaces;
   memory stack structures extending through the alternating stack and including a memory film and a vertical semiconductor channel;
   vertical field effect transistors which are located over the stepped surfaces and which electrically contact a respective electrically conductive layer; wherein:
   the vertical field effect transistors each include a bottom active region overlying and contacting a respective vertical contact via structure which is located in contact with a respective electrically conductive layer such that the vertical field effect transistors electrically contact a respective electrically conductive layer;
   the stepped surfaces extend along a first horizontal direction with different lateral extents;
   each gate electrode of the vertical field effect transistors is electrically connected to one of two metal lines that extend along the first horizontal direction; wherein:
   each vertical field effect transistor comprises a vertical thin film transistor; each bottom active region comprises a source region of the vertical thin film transistor; and
   each upper active region of the vertical thin transistor is biased by metal lines that extend along a second horizontal direction that is different from the first horizontal direction.

2. The memory device of claim 1, wherein vertical field effect transistors are located over the stepped surfaces on opposite sides of an array of memory stack structures.

3. The memory device of claim 1, wherein:
   a subset of the vertical field effect transistors comprise a common gate electrode; and
   each of the subset of the vertical field effect transistors comprises a cylindrical gate dielectric contacting a respective inner sidewall of the common gate electrode and enclosing a transistor channel.

4. The memory device of claim 3, wherein:
   the common gate electrode comprises a semiconductor material and electrical dopant atoms; and
   the cylindrical gate dielectric comprises a dielectric oxide of the semiconductor material.

5. The memory device of claim 1, further comprising at least one contact level dielectric layer overlying the alternating stack, wherein each of the vertical field effect transistors has an interface between a respective transistor channel and a respective lower active region within a horizontal plane including a top surface of the at least one contact level dielectric layer.

6. The memory device of claim 1, further comprising:
   a transistor level dielectric material layer laterally surrounding, and overlying, gate electrodes of the vertical field effect transistors; and
   a via level dielectric material layer overlying the transistor level dielectric material layer through which transistor contact via structures extend.

7. The memory device of claim 1, wherein:
   each of the vertical field effect transistors comprises a transistor channel that is self-aligned to a respective upper active region thereof; and
   at least one transistor channel of the vertical field effect transistors is laterally offset from a respective lower active region.

8. The memory device of claim 1, wherein:
   the memory device comprises a vertical NAND device;
   the electrically conductive layers comprise word lines for memory elements within the memory stack structure; and
   the vertical field effect transistors comprise word line switches that control application of a bias voltage to the word lines.

9. The memory device of claim 8, wherein:
   the electrically conductive layers further comprise a select gate electrode that controls activation of the memory stack structure;
   the vertical field effect transistors further comprise a select gate electrode switch that controls application of another bias voltage to the select gate electrode; and
   one or more CMOS devices of a word line data latch and word line level shifter circuit are located in or on a substrate in a peripheral area and are electrically connected to gate electrodes of the vertical field effect transistors.

10. The memory device of claim 1, wherein:
    the memory device comprises a vertical NAND device located over the substrate;
    the electrically conductive layers comprise, or are electrically connected to, a respective word line of the NAND device;
    the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *